US012775220B2

(12) United States Patent
Hsu et al.

(10) Patent No.: US 12,775,220 B2
(45) Date of Patent: Oct. 27, 2026

(54) EUV SOURCE STABILIZATION APPARATUS AND METHOD

(71) Applicant: TAIWAN SEMICONDUCTOR MANUFACTURING COMPANY, LTD., Hsinchu (TW)

(72) Inventors: Tzu Jeng Hsu, Taoyuan City (TW); Shy-Jay Lin, Jhudong Township (TW); Chih-Wei Wen, Tainan City (TW); Hsin-Fu Tseng, Zhubei City (TW); Chien-Hsing Lu, Tainan City (TW); Chih-Chiang Tu, Tauyen (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 628 days.

(21) Appl. No.: 18/118,023

(22) Filed: Mar. 6, 2023

(65) Prior Publication Data

US 2024/0004318 A1 Jan. 4, 2024

Related U.S. Application Data

(60) Provisional application No. 63/357,647, filed on Jul. 1, 2022.

(51) Int. Cl.
*G03F 7/00* (2006.01)
*H05G 2/00* (2006.01)

(52) U.S. Cl.
CPC ...... *G03F 7/70916* (2013.01); *G03F 7/70033* (2013.01); *G03F 7/70808* (2013.01); *H05G 2/002* (2024.08); *H05G 2/0094* (2024.08)

(58) Field of Classification Search
CPC ............. G03F 7/70916; G03F 7/70033; G03F 7/70808; H05G 2/0094; H05G 2/002
See application file for complete search history.

(56) References Cited

U.S. PATENT DOCUMENTS 8,796,666 B1 8/2014 Huang et al.
9,013,679 B2 4/2015 Labetski et al.
9,093,530 B2 7/2015 Huang et al.
9,184,054 B1 11/2015 Huang et al.
9,256,123 B2 2/2016 Shih et al.
9,529,268 B2 12/2016 Chang et al.
9,548,303 B2 1/2017 Lee et al.
9,618,837 B2 4/2017 Lu et al.
9,869,928 B2 1/2018 Huang et al.
9,869,934 B2 1/2018 Huang et al.
(Continued)

*Primary Examiner* — Georgia Y Epps
*Assistant Examiner* — Hanway Chang
(74) *Attorney, Agent, or Firm* — STUDEBAKER BRACKETT PLLC

(57) ABSTRACT

To improve EUV emission stability, bumps and eaves are added to the interior wall of a rotating crucible that produces EUV light by vaporizing a pre-heated metal, such as tin, using a laser. The bumps and eaves prevent migration of debris and control liquid metal flow, which is otherwise distributed over time by the centrifugal forces generated as the crucible rotates. The bumps and eaves stabilize EUV emissions by changing turbulent liquid metal flow to a predominately laminar flow. Tin catchers of various designs are available to collect and recycle a significant portion of the debris and unused liquid metal. A closed crucible chamber design alleviates non-uniform heating issues.

20 Claims, 20 Drawing Sheets

(56) References Cited

U.S. PATENT DOCUMENTS

| | | | | |
|---|---|---|---|---|
| 9,869,939 | B2 | 1/2018 | Yu et al. | |
| 2014/0326904 | A1 | 11/2014 | Ceglio et al. | |
| 2015/0282285 | A1* | 10/2015 | Shirai ..................... | H01J 61/06<br>315/246 |

* cited by examiner

210

210

EUV SOURCE STABILIZATION APPARATUS AND METHOD

CROSS REFERENCE TO RELATED APPLICATIONS

This application claims priority under 35 U.S.C. § 119(e) to U.S. Provisional Patent Application Ser. No. 63/357,647 entitled "A NOVEL EUV SOURCE STABILIZATION METHOD" filed on Jul. 1, 2022, the entirety of which is hereby incorporated by reference.

BACKGROUND

One growing technique for semiconductor manufacturing is extreme ultraviolet (EUV) lithography. EUV employs scanners using light in the EUV spectrum of electromagnetic radiation, including wavelengths from about one nanometer (nm) to about one hundred nm. Many EUV scanners still utilize projection printing, similar to various earlier optical scanners, except EUV scanners accomplish it with reflective rather than refractive optics, that is, with mirrors instead of lenses.

EUV lithography employs a laser-produced plasma (LPP), which emits EUV light. The LPP is produced by focusing a high-power laser beam, from a carbon dioxide ($CO_2$) laser and the like, onto a metal target, such as tin (Sn), in order to transition it into a highly ionized plasma state. This LPP emits EUV light with a peak maximum emission of about 13.5 nm or smaller. The EUV light is then collected by a collector and reflected by optics towards a lithography exposure object, such as a semiconductor wafer. Tin debris is generated in the process, which over time adversely affect the overall operational performance and efficiency of the EUV apparatus.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
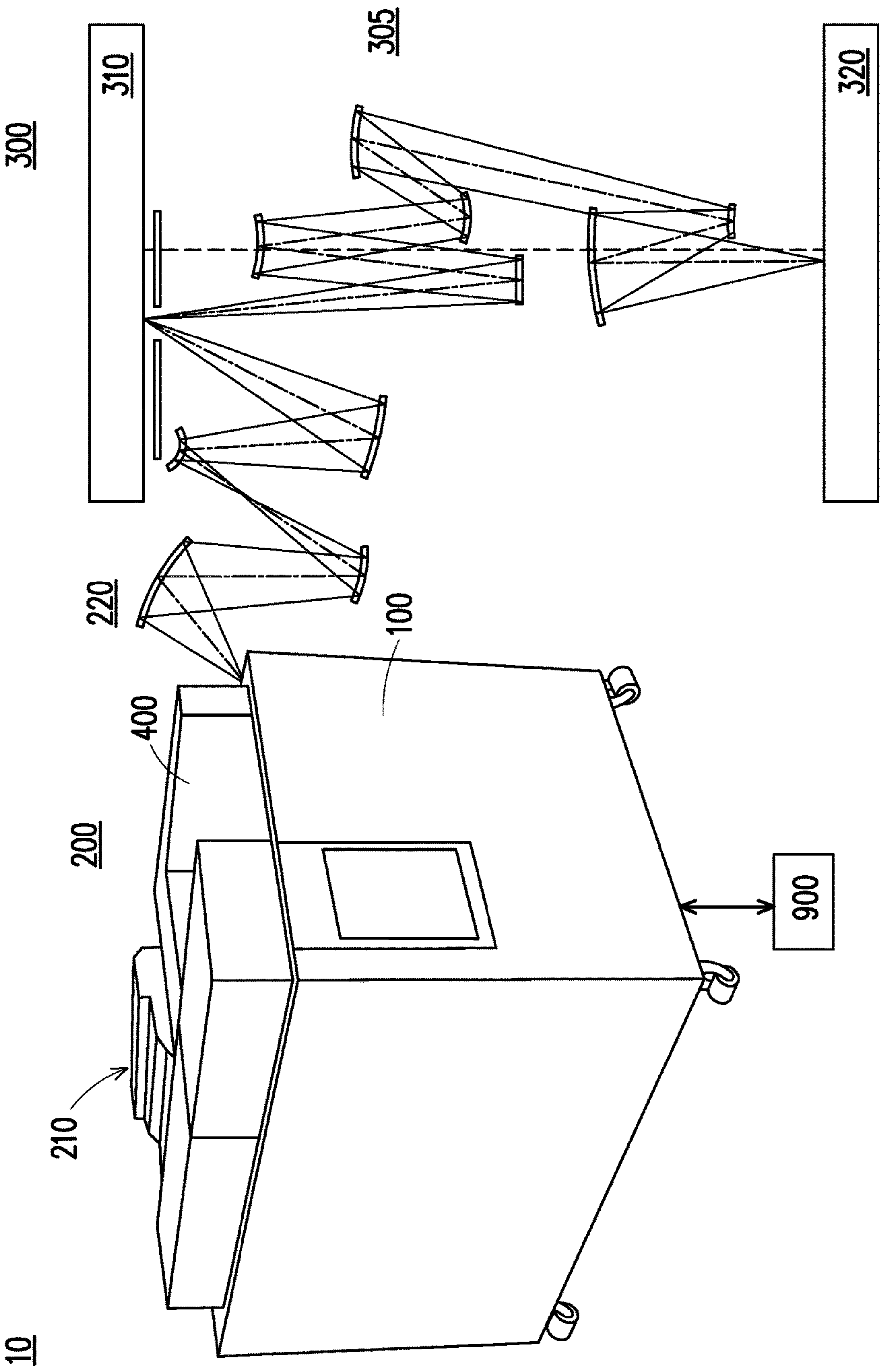
FIG. 1 is a schematic view of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. In various embodiments, the mask includes multiple reflective layers (ML) deposited on the substrate. In some embodiments, the multiple layers include a plurality of film pairs, such as molybdenum-silicon (Mo/Si) film pairs (e.g., a layer of molybdenum above or below a layer of silicon in each film pair). Alternatively, the multiple layers include molybdenum-beryllium (Mo/Be) film pairs, or other suitable materials that are configurable to highly reflect the EUV light in some embodiments. The mask further includes a capping layer, such as ruthenium (Ru), disposed on the ML for protection in some embodiments. In various embodiments, the mask further includes an absorption layer, such as a tantalum boron nitride (TaBN) layer, deposited over the multiple layers. The absorption layer is patterned to define a layer of an integrated circuit (IC) in some embodiments. Alternatively, another reflective layer is deposited over the multiple layers and is patterned to define a layer of the IC, thereby forming an EUV phase shift mask or the like.

In various embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform various lithography exposing processes. The lithography system may further include other modules or be integrated with (or be coupled with) other modules.

A lithography system is essentially a light projection system. Light is projected through a 'mask' or 'reticle' that constitutes a blueprint of the pattern that will be printed on a workpiece. The blueprint is four times larger than the intended pattern on the wafer or chip. With the pattern encoded in the light, the system's optics shrink and focus the pattern onto a silicon wafer coated with a photoresist. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more, laying patterns on top of patterns. The size of the features to be printed varies depending on the layer, which means that different types of lithography systems are used for different layers, from the latest-generation EUV systems for the smallest features to older deep ultraviolet (DUV) systems for the largest. Although various embodiments disclosed herein are described with respect to an EUV light generating apparatus used for semiconductor wafer lithography, it is readily apparent that other applications of the disclosed embodiments may include other systems that require EUV light without limitation, such as a precision metrology system.

FIG. 1 is a schematic and diagrammatic view of an EUV lithography system 10, which in some embodiments is a rotating target EUV lithography apparatus. The EUV lithography system includes an EUV radiation source apparatus 100 (sometimes referred to herein as a "source side," in reference to it or one or more of its relevant parts) to generate EUV light, an exposure tool 300 (sometimes referred to herein as the "scanner side" in reference to it or one or more of its relevant parts), and an excitation laser source apparatus 200. In various embodiments, the EUV radiation source apparatus 100 and the exposure tool 300 are coupled to each other by a coupling mechanism, which transfers generated EUV light from the EUV radiation source apparatus 100 to the exposure tool 300 via suitable optics 220, such as reflective mirrors. The coupling mechanism includes a focusing unit (not shown) to focus the transferred EUV light in some embodiments.

The exposure tool 300 includes various reflective optic components, such as convex/convex/flat mirrors, a mask holding mechanism 310 including a mask stage (i.e., a "reticle stage"), and wafer holding mechanism 320 (i.e., a "wafer stage"). The EUV radiation generated by the EUV radiation source apparatus 100 is guided by the reflective optical components 305 onto a mask (not shown) secured on the reticle stage 310. In some embodiments, the distance from the source side 100 to the reticle stage 310 disposed in the scanner side is approximately 2 meters. In some embodiments, the reticle size is approximately 152 mm by 152 mm. In some embodiments, the EUV light patterned by the mask is used to process a wafer supported on wafer stage 320. In various embodiments, a local workstation 400 controls the laser source apparatus 200. In various embodiments, a controller 900 controls the EUV lithography system 10 and/or one or more of its components remotely as described herein.

In various embodiments, the EUV lithography system 10 is designed to expose a semiconductor wafer to EUV light (or EUV radiation) in order to pattern the same during manufacturing. In some embodiments, the wafer includes a material sensitive to the EUV light (e.g., photoresist). In various embodiments, the EUV lithography system 10 employs the EUV radiation source apparatus 100 to generate EUV light having a wavelength ranging between about 1 nanometer (nm) and about 100 nm. In one particular example, the EUV radiation source apparatus 100 generates EUV light with a wavelength centered at about 13.5 nm. In various embodiments, the EUV radiation source apparatus 100 utilizes LPP to generate the EUV radiation in various desired wavelengths. The LPP emits EUV radiation, which is collected by a collector that reflects and focuses the EUV radiation for a subsequent lithography exposing processes in the scanner side 300.

In various embodiments, the laser source apparatus 200 includes a crucible 210, which provides the target material for the laser, and within which the laser is at least partially disposed. In various embodiments, the target material is deposited within a target region on an interior wall of the crucible 210. As the target region is rotated to the laser's excitation zone, having a width between 30 μm and 100 μm, laser light is directed through windows or lenses (not shown) into a non-moving excitation zone to transform the target metal into a LPP. In some embodiments, the laser light is continuous during operation during operation of the apparatus 10. In various embodiments, the laser light is pulsed and synchronized with the rotation of the target material within the crucible 210. When the laser light heats the target metal, a high-temperature LPP is generated. These functions will be described in more detail later below.

In various embodiments, the LPP generated by the laser light creates random physical debris, such as ions, gases and atoms of the target metal, along with the desired EUV light. Accordingly, in some embodiments, during operation of the apparatus 10, there is an undesirable accumulation of debris that settles on various components of the source side 100, as well as the excitation laser source apparatus 200 over time. This, in various embodiments, causes intensity fluctuation in the generation of EUV light, as debris accumulation causes defocusing of the laser light on the target material. For example, where the laser spot size is designed to be approximately 30 micrometers (μm) in diameter, and defocus caused by debris on the target region of the crucible 210 is approximately 3 μm, the laser spot size instead becomes 33 μm. The laser spot volume is consequently expanded approximately 120%. Assuming that laser power is not changed to compensate, EUV light intensity will be lower by approximately 6%. Accordingly, laser spot size is a key factor to maintaining the stability of generated EUV light intensity.

Figure 2A:
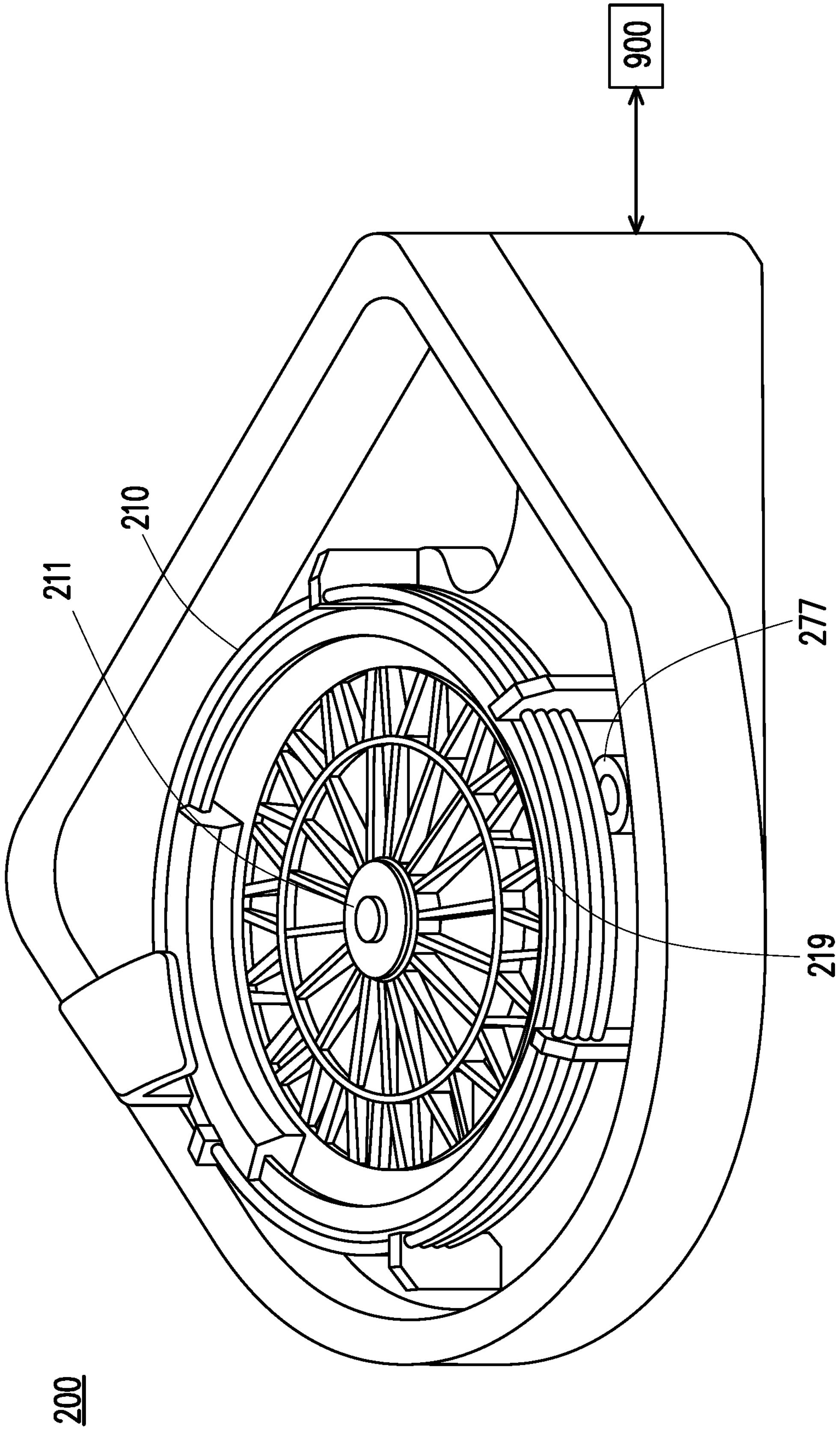
FIG. 2A is a perspective view of a crucible in accordance with some embodiments.

FIG. 2A is a perspective view of the crucible 210 used within the laser source apparatus 200 in accordance with various embodiments. In various embodiments, the crucible 210 is made of a metal, such as a stainless steel or a steel alloy. In some embodiments, the crucible 210 is made of other metals that are dissimilar from the target metal or metals used therewith. In various embodiments, the crucible 210 rotates around its center 211 during operation of the system 10. In some embodiments, the crucible rotates up to 25,000 rotations per minute (rpm), such as 19,920 rpm. In some embodiments, a motor 277 is provided to rotate the crucible 210. In various embodiments, the crucible 210 has an outer wall 219 having a cross-section that is substantially circular, however all embodiments are not so limited. In some embodiments, the rotation of the crucible 210 is controlled by the controller 900 as described later.

Figure 2B:
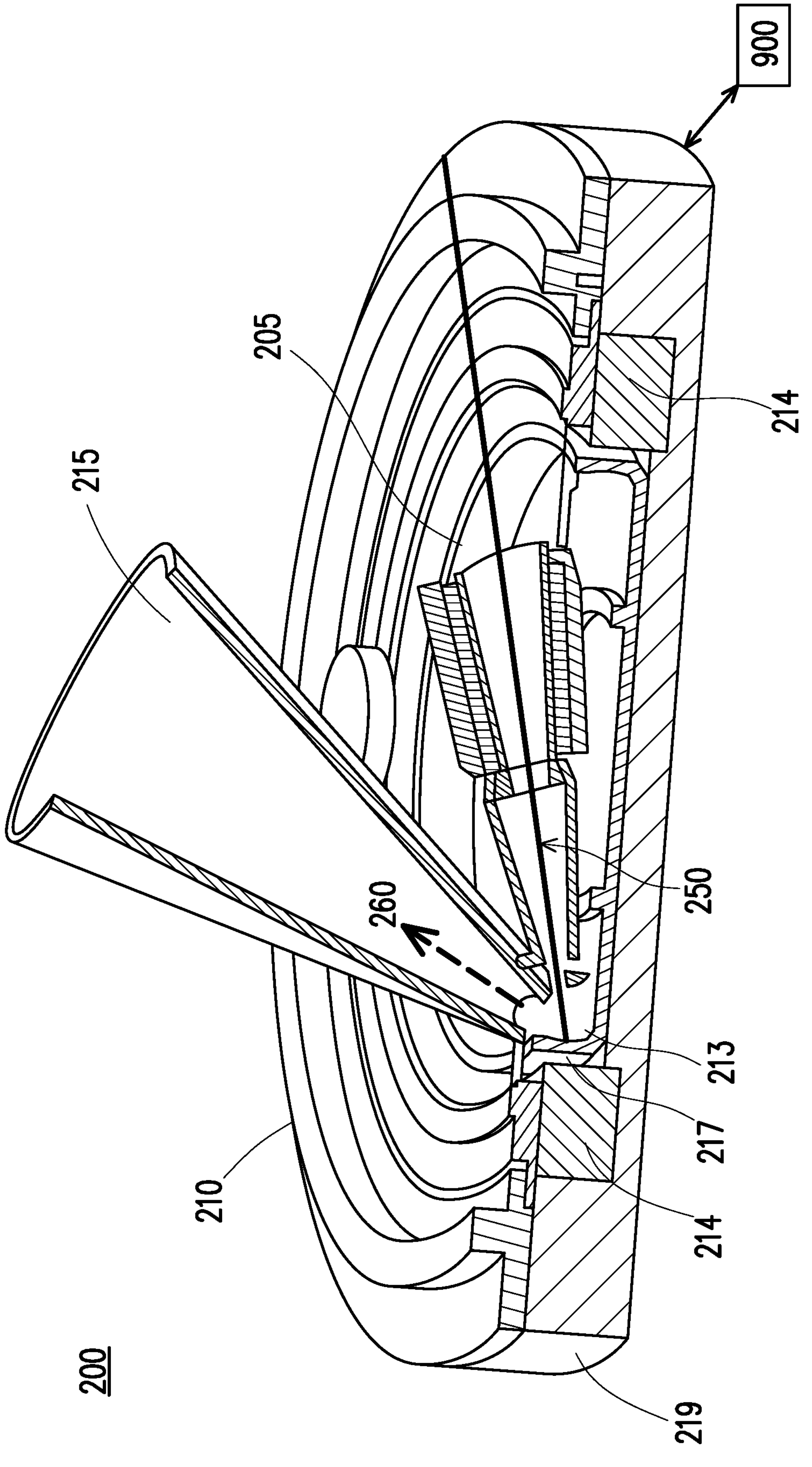
FIG. 2B is a further perspective view of a crucible in accordance with some embodiments.

FIG. 2B is a further perspective view of the crucible 210 in accordance with various embodiments. In various embodiments, a target metal is disposed within a target region 217 on at least a portion of an interior of the wall 219 of the crucible 210. In some embodiments, the target region 217 is a continuous band disposed radially or circumferentially around the entirety of the interior of the wall 219. In some embodiments, the target region 217 is between 10 and 100 mm wide. In some embodiments, the target region 217 is disposed such that it includes the midpoint of the wall 219. In some embodiments, no portion of the target region 217 is disposed at the top of the wall 219 or at the bottom of the wall 219.

In some embodiments, a heater 214 is circumferentially disposed around an exterior of the wall 219 for conductively heating the target region 217, and thereby pre-heating and at least partially liquifying any target metal deposited thereon. The pre-heated target metal is subsequently further heated and vaporized by laser light 250 from the laser 205, thereby generating emission of EUV light 260. The EUV light 260 is collected by an externally disposed EUV collector 215 and transferred to the scanner side 300 thereafter. In various embodiments, a debris catching region 213 is disposed radially around at least a portion of the interior of the wall 219 and beneath the target region 217 to catch unused metal and metal debris during operation of the apparatus 10.

In some embodiments, the excitation laser source apparatus 200 includes an infrared (IR) laser 205. In some embodiments, the laser 205 operates in one or more of the following frequency ranges: near-infrared (or IR-A, wavelength 0.78-1.4 μm), mid-infrared (IR-B, 1.4-3 μm), far-infrared (IR-C, 3-1000 μm). The excitation laser source apparatus 200 may include a laser generator, laser guide optics and a focusing apparatus (not shown) disposed within or outside the crucible 210. In various embodiments, the laser 205 includes an infrared laser source having a laser diode (not shown). In other embodiments, the laser is a solid state laser, such as a carbon dioxide ($CO_2$) laser source, or a neodymium-doped yttrium aluminum garnet (Nd:YAG) laser source.

The EUV excitation laser source apparatus 210 uses a substantially stationary laser 205 to superheat a target metal disposed within the target region 217 as the crucible 210 rotates at high speed. In some embodiments, the laser light 250 is substantially continuous during operation of the apparatus 10. In other embodiments, the laser light 250 is pulsed. In some embodiments, the target metal is a tin (Sn), a tin alloy or other useful metal. Various embodiments will sometimes be described herein as using an Sn liquid film that is continuously deposited on the target region 217 during operation of the apparatus 10. In various embodiments, the liquid film thickness (i.e., reflux) is kept uniform on the wall 219 of the crucible 210, in order to keep the laser spot size uniform and prevent instabilities of the generated EUV light 260 attributable to laser defocus. As the crucible 210 is rotated, tin within the target region 217 is preheated by the heater 214. The laser 205 remains substantially stationary and targets a non-moving excitation zone within the target region 217. As the tin is rotated into the excitation zone of the laser 205, it is mostly vaporized and transformed into a hot Sn plasma that reaches temperatures of 4000 degrees Celsius or higher. A large amount of infrared laser energy is used to ionize the Sn and, in some embodiments, excites the Sn to an ionized transition state of between $Sn^{8+}$ and $Sn^{14+}$. In various embodiments, these Sn ions will then radiate EUV light at about 13.5 nm+/−2% as they return from the transition state to a ground state. In various embodiments, pure Sn is the most useful material to use as the target metal, since it provides a high energy conversion efficiency to readily achieve the desired 13.5 nm wavelength. However, other material can also be used for the target metal, including a liquid metal such as a eutectic alloy containing Sn and lithium (Li).

In various embodiments, a buffer gas is supplied from a buffer gas supply (not shown) within the crucible 210 where the laser light 250 is delivered to the target metal 217. In some embodiments, the buffer gas is hydrogen ($H_2$), helium (He), argon (Ar), nitrogen ($N_2$), or another inert gas. In certain embodiments, $H_2$ is used, because H radicals generated by ionization of the buffer gas can also be used for cleaning purposes. Further, the crucible 210 includes one or more gas outlets (not shown) so that the buffer gas is exhausted therefrom during maintenance periods and the like.

Figure 2C:
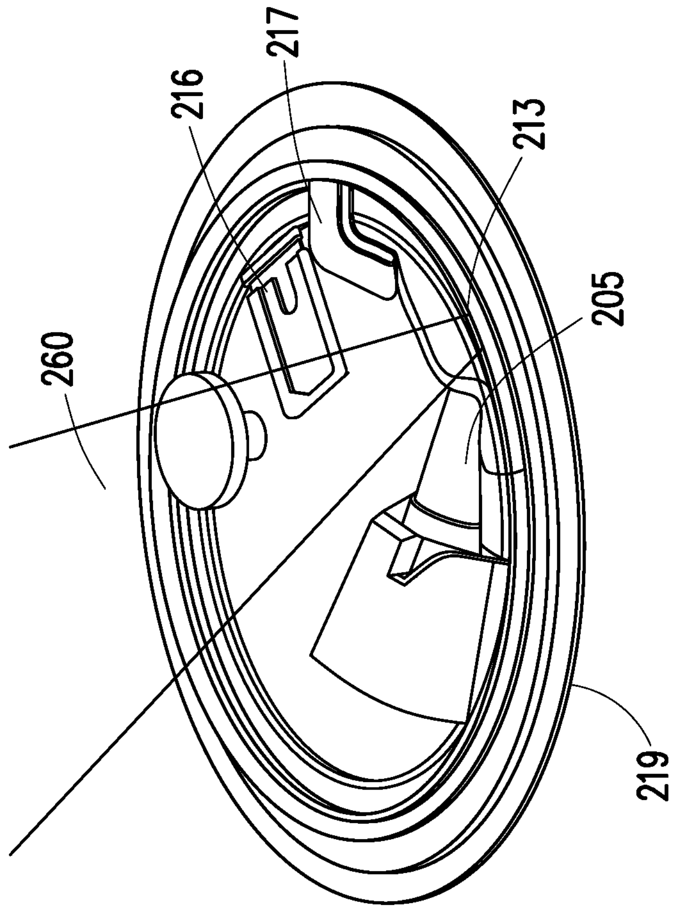
FIG. 2C is another perspective view of a crucible in accordance with some embodiments.

FIG. 2C is another perspective view of the crucible 210 in accordance with various embodiments. In various embodiments, a re-filler 216 is configured to add target metal into the crucible 210. In some embodiments, the re-filler 216 is configured to deposit metal on the target region 217 as the crucible 210 rotates. In some embodiments, the re-filler 216 is supplied by a refill tank (not shown). In some embodiments, recycled metal is additionally supplied from the debris collecting region 213 as described in more detail later. In some embodiments, the metal is preheated on the target region 217 by the heater 214, thus forming a heated metal target region. During operation of the system 10, the fast rotation of the crucible 210 generates centrifugal forces that, in turn, cause heated metal leakage from crucible 210 and the bottom of the debris catching region 213 in various embodiments. When too much metal debris accumulates at the edge of the crucible 210 in some embodiments, the crucible 210 becomes partially blocked. Over time, such leakage will also cause the metal deposited in the target region 217 to become thinner, which, in turn, can destabilize EUV light collected by the EUV collector 215.

Figure 2D:
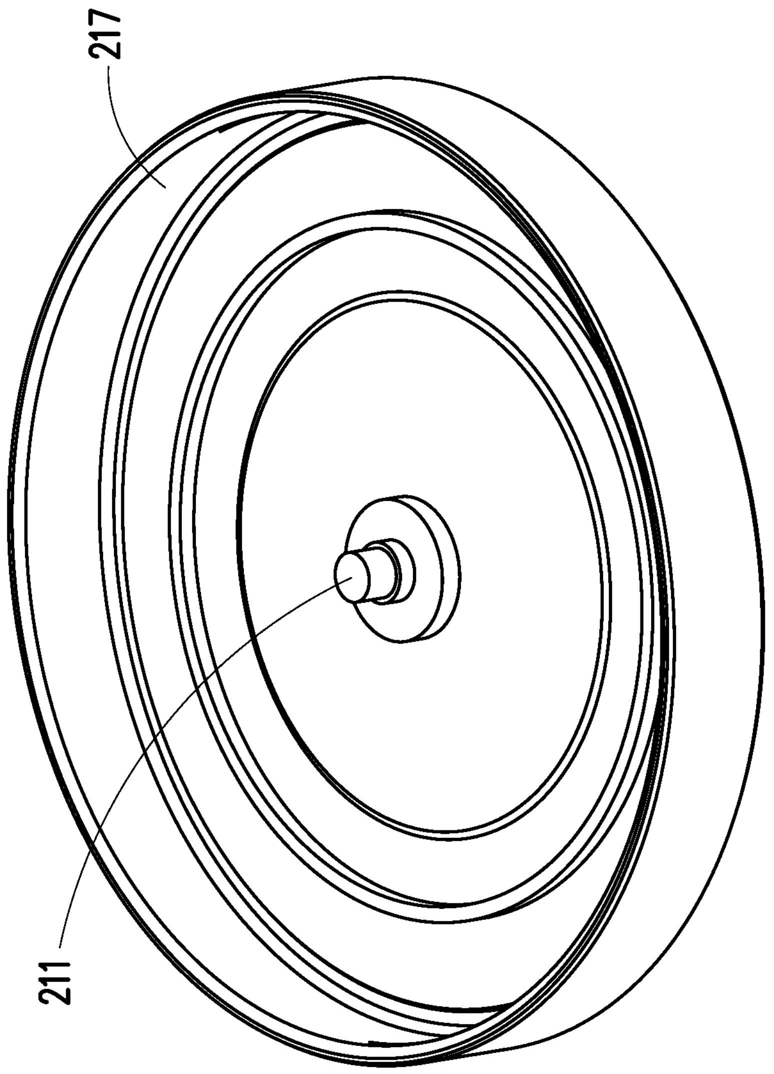
FIG. 2D is an additional perspective view of a crucible in accordance with some embodiments.

FIG. 2D is an additional perspective view of the crucible 210 in accordance with various embodiments. In various embodiments, the target region 217 is disposed circumferentially around the entirety of an interior of the wall 219 as shown. In some embodiments, the target region 217 is disposed radially around at least a portion of an interior of the wall.

Figure 2E:
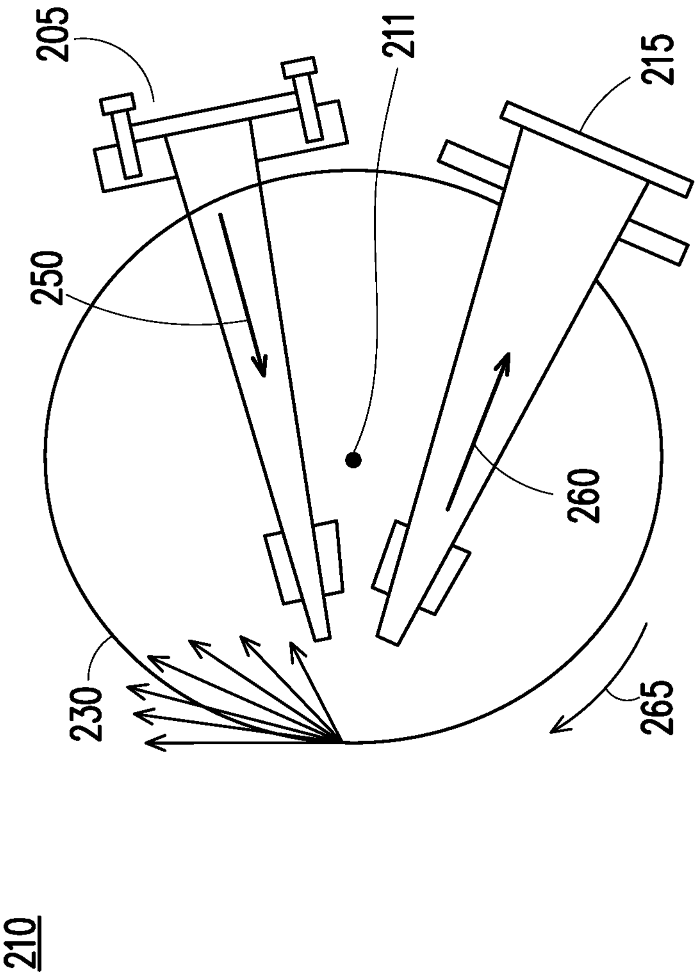
FIG. 2E is a top view of a crucible in accordance with some embodiments.

FIG. 2E is a top view of various components of the crucible 210 in accordance with various embodiments. As shown therein, the laser 205 generates laser light 250 that is directed to an excitation region on the interior of the wall 219 in the target region 217. As the crucible 210 rotates in the rotation direction 265 around its central point 211, the laser light 150 vaporizes much of the liquid metal continuously deposited within the target region 217, thus causing an emission of EUV light 260, which is collected by the EUV collector 215 and transmitted to the scanner side 300 in various embodiments. In some embodiments, the EUV collector 215 includes a proper coating material for EUV collection, reflection, and focusing. In some embodiments, the coating material of the EUV collector 215 is similar to the reflective multilayer of an EUV mask. In some embodiments, the coating material of the EUV collector 215 includes multiple layers, such as a plurality of molybdenum/silicon (Mo/Si) film pairs, and further include a capping layer (such as ruthenium (Ru)) coated on the multiple layers to substantially transfer the EUV light 260 while minimizing or eliminating absorption thereof.

Figure 3A:
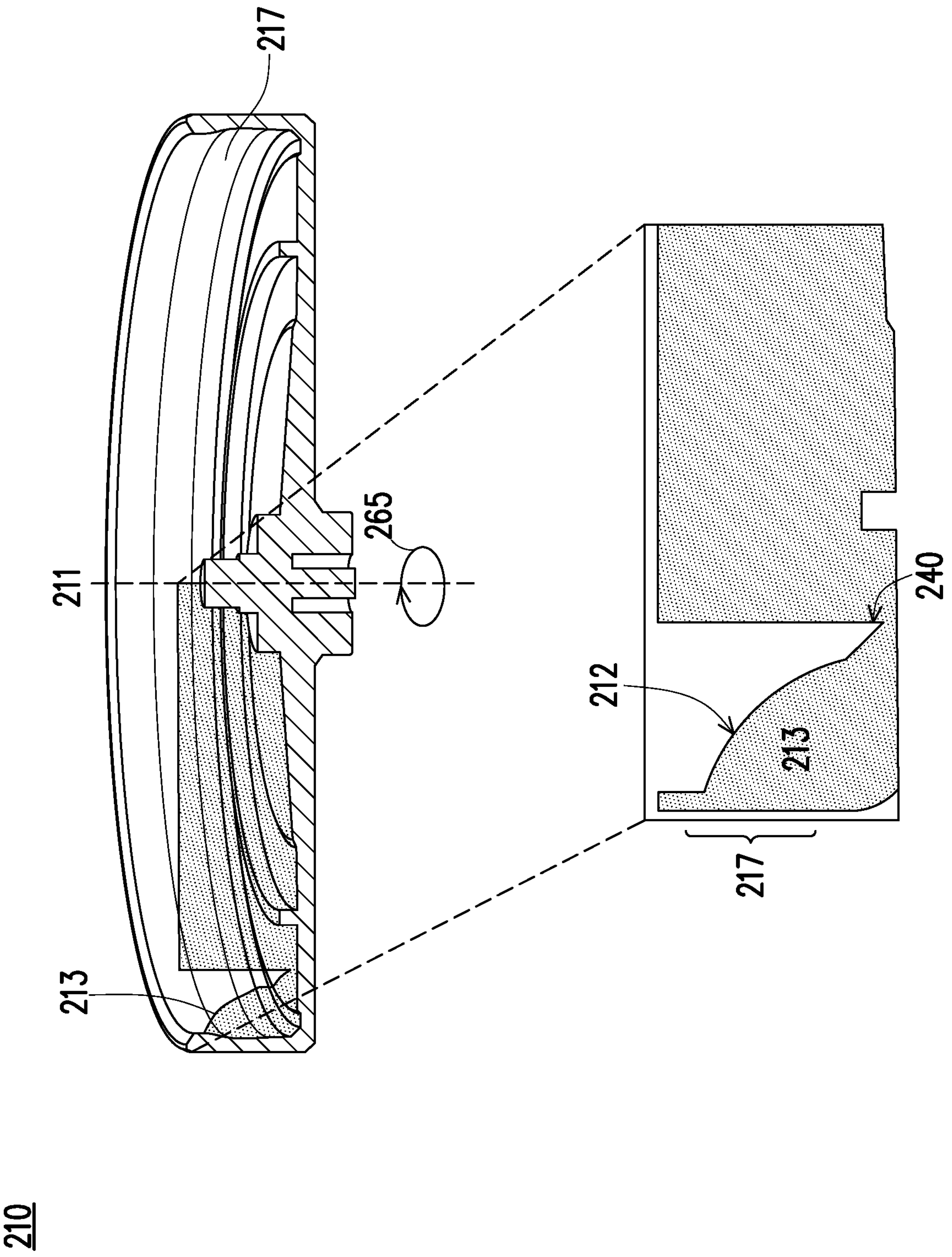
FIG. 3A is a side view of a crucible in accordance with some embodiments.

FIG. 3A is a side view of the crucible 210 in accordance with various embodiments. During the EUV light generation process, some target metal does not get vaporized and instead remains in the crucible 210 as metal debris 230. In some embodiments, the debris catching region 213, having a sloped surface 212 and a bottom 240, is provided to collect a significant portion of the metal debris 230. In some embodiments, the debris catching region 213 is at least partially disposed below the target region 217. In some embodiments, the debris catching region 213 is entirely disposed below the target region 217.

Figure 3B:
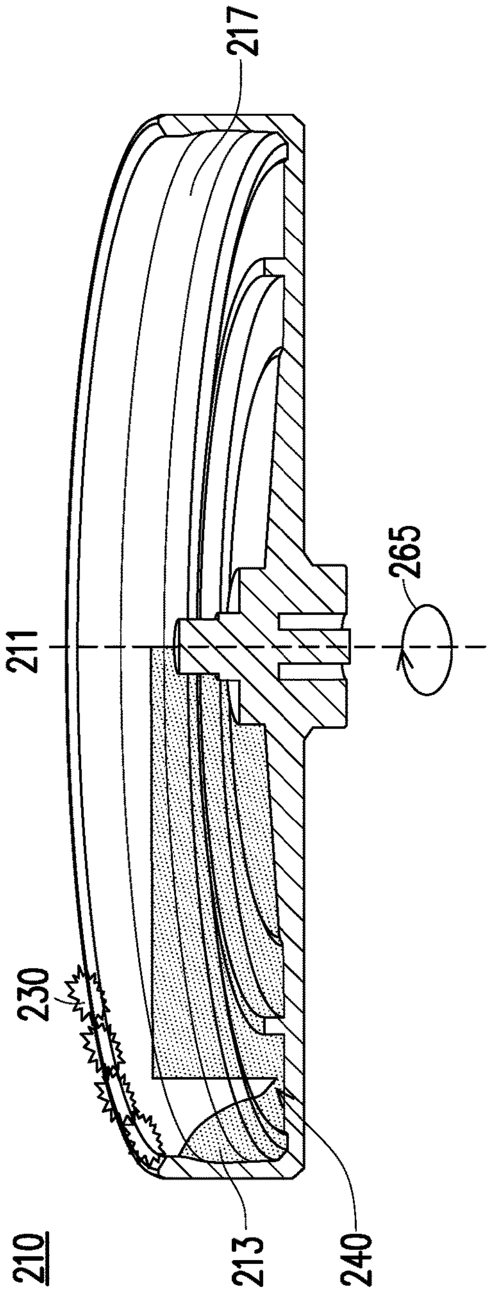
FIG. 3B is a further side view of a crucible in accordance with some embodiments.
Figure 3C:
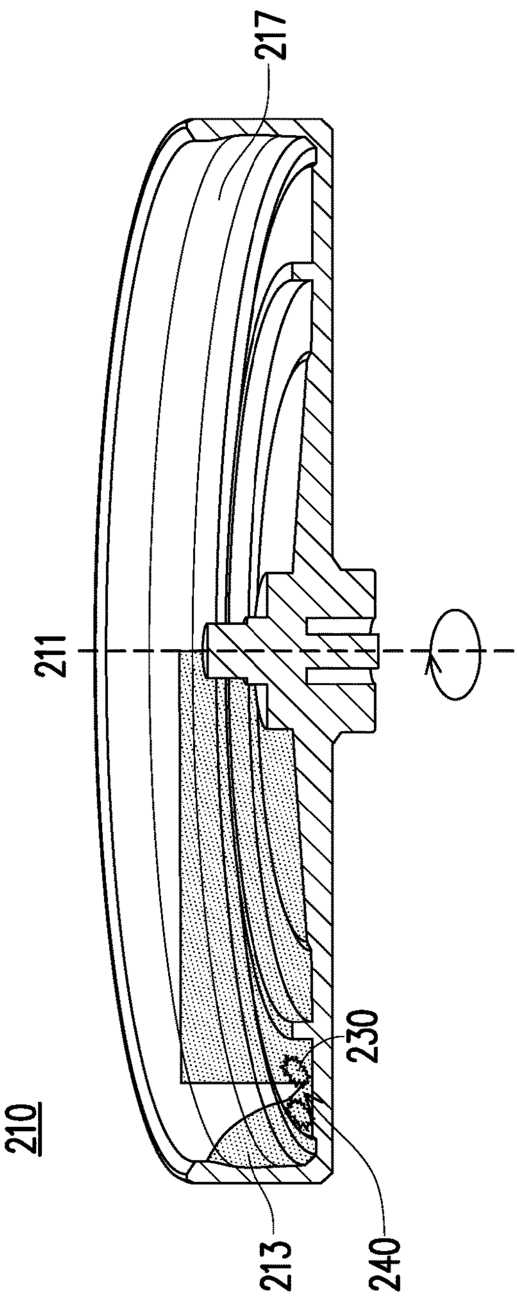
FIG. 3C is an additional view of a crucible in accordance with some embodiments.

FIG. 3B is a further side view of the crucible 210 in accordance with various embodiments, diagrammatically illustrating metal debris 230 accumulating on the top edge of the wall 219 of the crucible 210. FIG. 3C is an additional view of the crucible 210 in accordance with various embodiments, diagrammatically illustrating metal debris 230 accumulating around a bottom 240 of the debris catching region 213.

Figure 4A:
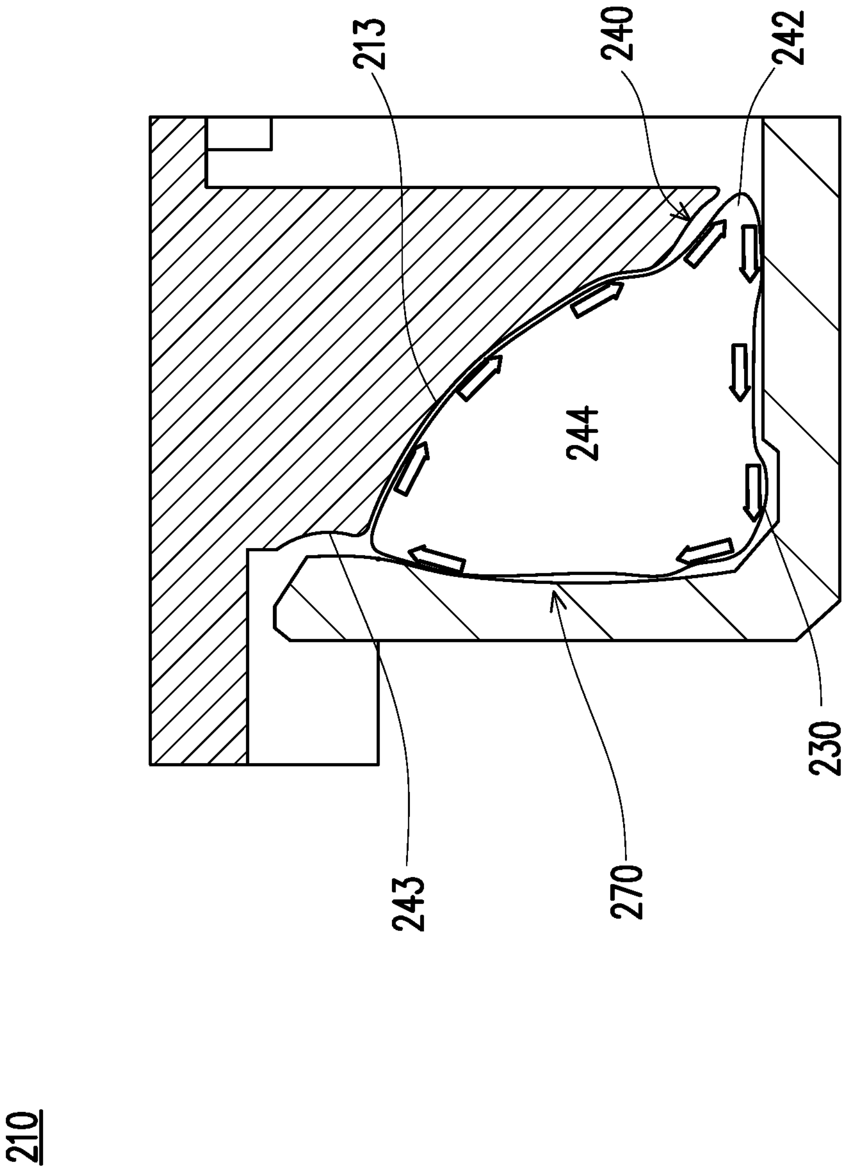
FIG. 4A is a side view of a tin catcher in accordance with some embodiments.

FIG. 4A is a side view of the debris catching region 213 in accordance with various embodiments. In various embodiments, the bottom portion 240 of the debris catching region 230 includes an inlet 242, sometimes referred to herein as a debris return, which collects metal debris 230 generated on the target region 217 that flows down the debris catching region 213. In some embodiments, the debris catching region 213 has a hollow interior region 244 in communication with the inlet 242. In some embodiments, the inlet 242 collects and provides metal debris 230 to the hollow interior region 244. In some embodiments, the hollow interior region 244 includes an outer sidewall 270 disposed towards the wall 219 of the crucible 210. The outer sidewall is convex, substantially vertical or convex in alternate embodiments. In some embodiments, as metal debris 230 migrates around the hollow interior region 244 one or more times in a counterclockwise direction, a significant portion is directed to the outlet 243 immediately and over time. In various embodiments, the outlet 243 is disposed above the inlet 242. In various embodiments, the outlet 243 is configured to provide recycled metal debris 230 to the target region 217 by operation of centrifugal force that, due to the rotation of the crucible 210, forces the metal debris 230 from the inlet 242 up to the outlet 243. In some embodiments, the outlet 243 at least partially replenishes the metal supplied to the target region 217 for vaporization by the laser 205 via such recycling. In alternate embodiments, the outlet 243 instead or additionally provides collected metal debris 230 to the re-filler 216 for recycling the metal debris 230 with fresh supply of new metal, which is subsequently deposited on the target region 217 within the laser excitation zone.

Figure 4B:
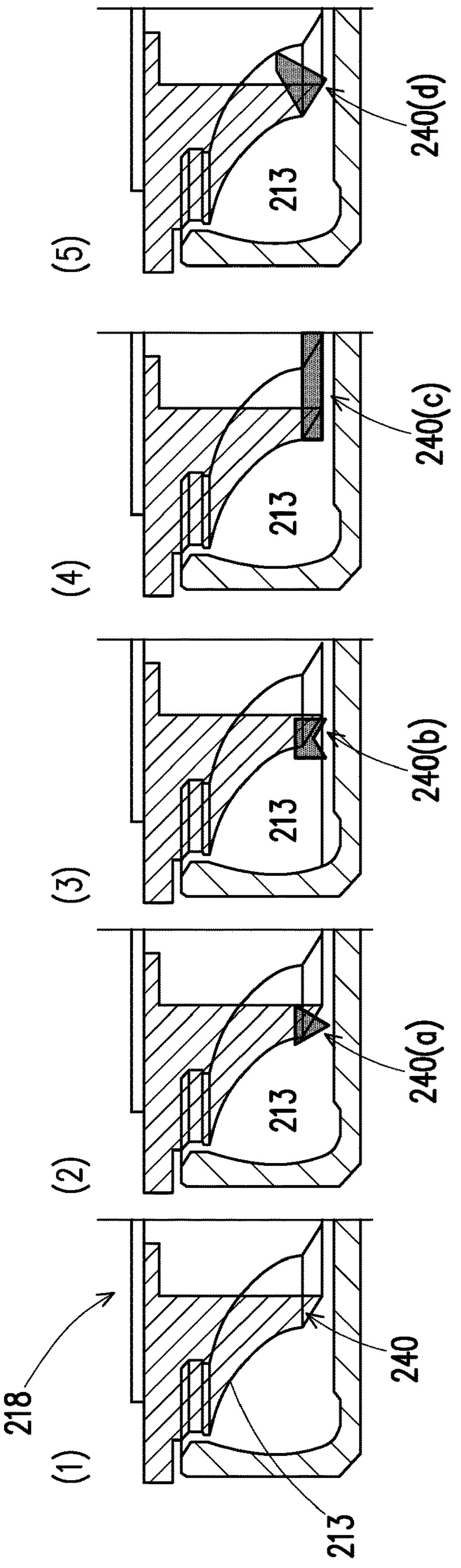
FIG. 4B shows side views of additional tin catchers in accordance with some embodiments.

FIG. 4B shows side views of alternate designs of a debris catching region 213 in accordance with various embodiments, in which different shapes of the bottom 240 are presented in cross-section. For example, the bottom 240 of the debris catching region 213 is, in alternate embodiments, a triangle 240(*a*), a pronged or fork shape 240(*b*), a square or rectangular shape 240(*c*), and a barb or multi-sided polygonal shape 240(*d*), but is not limited to just these shapes. In some embodiments, the cross section of the bottom 240 is any useful shape for containing metal debris 230 and discouraging debris migration.

Also shown in FIG. 4B is a cross section of a cover 218 disposed on a top of the crucible 210, in various embodiments. In such embodiments, the cover 218 is configured to at least partially enclose an interior of the crucible 210 during operation thereof, in order to promote heat uniformity within the crucible 210, thereby promoting laser spot size stability. Furthermore, the cover 218 prevents debris migration from the crucible 210 to other components of the system 10.

Figure 4D:
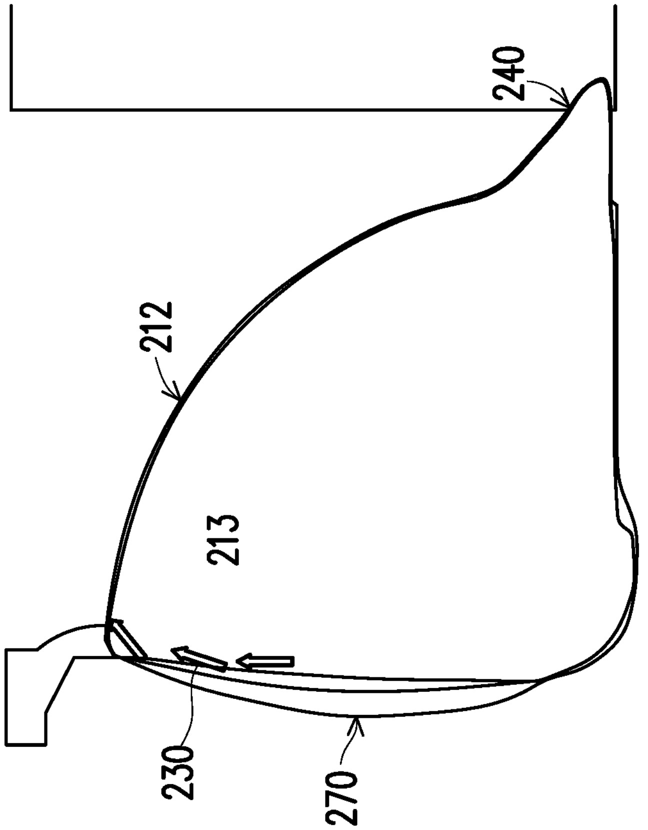
FIG. 4D is a further side view of a tin catcher in accordance with some embodiments.
Figure 4C:
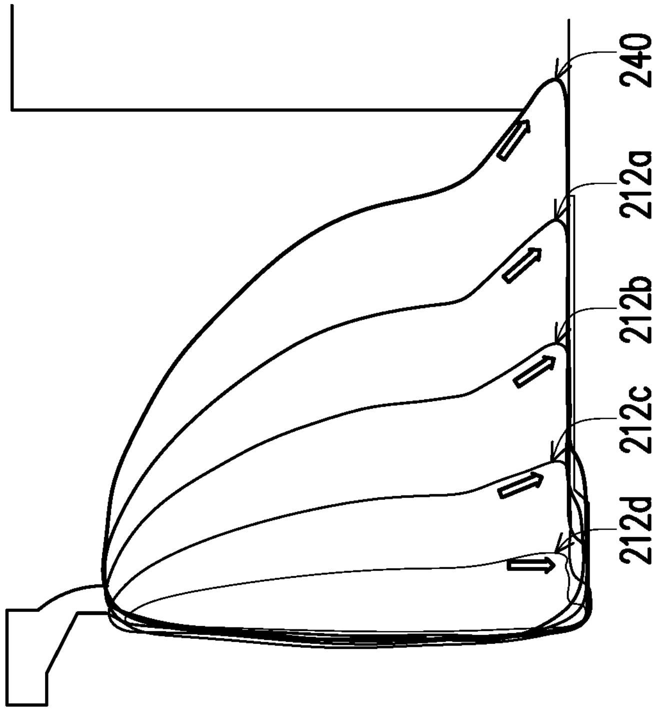
FIG. 4C is an additional side view of a tin catcher in accordance with some embodiments.

FIG. 4C is an additional side view of a debris catching region 213 in accordance with various embodiments, in which different curvatures (212*a*, 212*b*, 212*c*, 212*d*) of the slope 212 are illustrated. The steeper the slope 212, the larger the volume of the bottom 240 of the debris catching region 213 becomes, thereby retaining a greater portion of the metal debris 230 for recycling.

FIG. 4D is a further side view of the debris catching region 213 in accordance with various embodiments. In some embodiments, an interior of the wall 219 that encloses the outer portion of the hollow interior region 244 has a curvature 270 on which the metal debris 230 travels for recycling. In some embodiments, the outer portion of the hollow interior region has zero curvature, i.e., is substantially vertical. In some embodiments, the outer portion of the hollow interior region 244 has a curvature 270 that is slightly convex. In some embodiments, the outer portion of the hollow interior region 244 has a curvature 270 that is prominently convex. Other configurations of the outer portion of the hollow interior region 244 are readily contemplated. The optimal choice for the curvature 270 depends, in part, on the rotation speed of the crucible 210 during operation.

In standard operation of the rotating crucible 210, where metal in the target region 217 is pre-heated by the heater 214 and then vaporized by the laser 205, liquid metal flow from the target region 217 is random and turbulent in various embodiments. Migrating metal debris 230 interferes with the stability of EUV light generation in some embodiments. In various embodiments, some leakage of the metal debris 230 between the debris catching region 213 and the crucible 210 results, without further mitigating steps being taken. Accordingly, it is desirable to change such chaotic flow of metal debris to a laminar flow, which is then properly directed for collection.

Figure 5A:
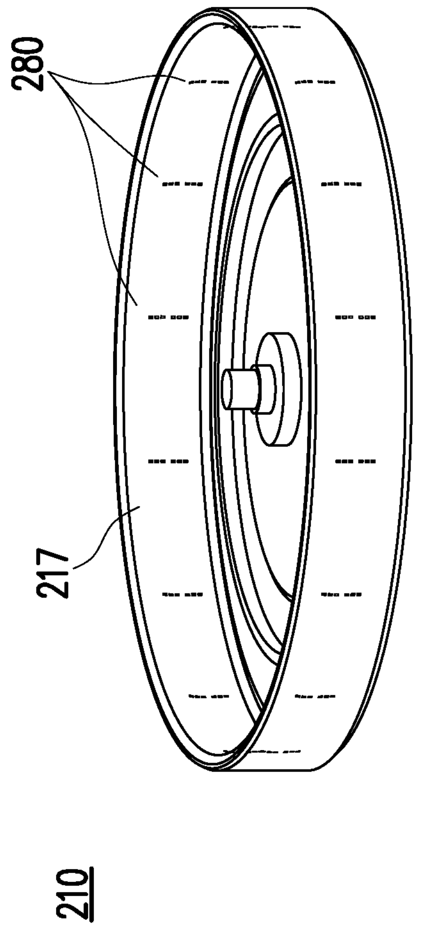
FIG. 5A is a perspective view of a crucible in accordance with some embodiments.

FIG. 5A is a perspective view of the crucible 210 in accordance with various embodiments. In order to advect liquid metal flow and to achieve and maintain stabilized EUV emission, one or more raised protrusions (sometimes referred to herein as punch marks or bumps) are added to the interior of the wall 219 of the crucible 210 in various embodiments. In such embodiments, the bumps 280 are designed to keep metal debris 230 below a certain level on the wall 219 and change turbulent flow to laminar flow. As described further herein, the bumps reduce upward metal debris migration, thereby reducing the fluctuations of the metal thickness in the target region 217 and resulting in improved EUV emission stability.

In various embodiments, the one or more bumps 280, or groups of bumps 280, are provided on the crucible surface to prevent liquid metal turbulence and debris migration. In various embodiments, one or more bumps 280 are disposed within the target region 217 for displacing a flow of heated metal within the rotating crucible 210. In various embodiments, a plurality of groups of bumps 280 are disposed radially or circumferentially around at least a portion of the target region 217. In various embodiments, the groups of bumps 280 are disposed in substantial vertical and horizontal alignment with each other. In various embodiments, the groups of bumps 280 are evenly distributed around the entirety of the wall 219 of the crucible 210 at equal radial separation. For example, 16 group of bumps 280 are evenly separated at about 22.5 degrees around the target metal region 217 in various embodiments. As another example, 32 groups of bumps 280 are evenly displaced at substantially 11.25 degrees separation within the target metal region 217. Other numbers of groups of bumps and separations are readily contemplated. In some embodiments, each bump 280 is formed by a metal punch through the exterior of the wall 219 or the like. In some embodiments, each bump 280 is separately formed of a similar or different durable material as the crucible 210 and then secured to the interior of the wall 219 by welding, bonding, adhering or similar useful method.

Figure 5B:
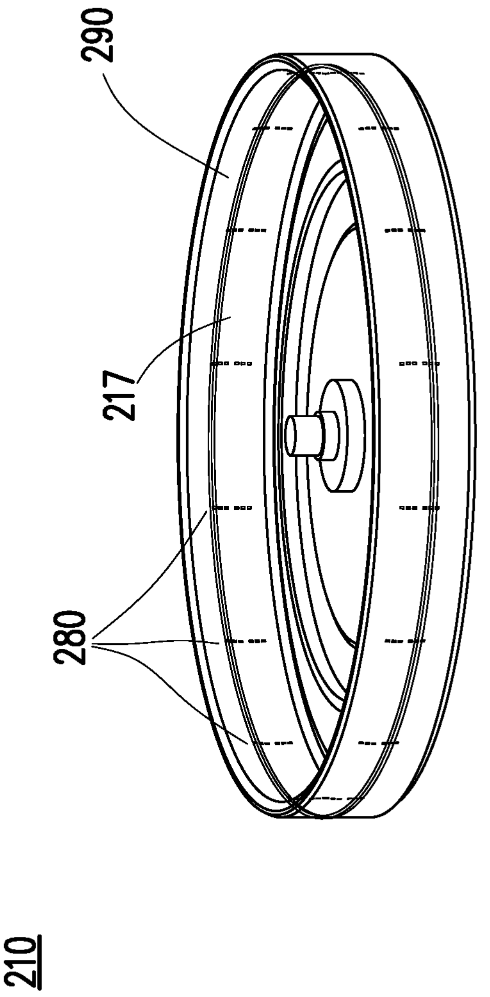
FIG. 5B is a further perspective view of a crucible in accordance with some embodiments.

FIG. 5B is a further perspective view of a crucible 210 in accordance with various embodiments, in which the crucible 210 includes an eave 290 disposed above the bumps 280, in order to further control liquid metal turbulence and to control debris migration. In various embodiments, the eave extends radially around at least a portion of the interior of the wall 219. In some embodiments, the eave 290 extends continuously and circumferentially around the entirety of the interior of the wall 219. In some embodiments, the eave 290 is convex-shaped and extends into the interior of the crucible 210 from the wall 219. In some embodiments, the height of the eave 290 is between about 0.25 mm and about 1.0 mm. In some embodiments, the thickness of the eave is between about 0.5 mm and about 1.5 mm. In some embodiments, the eave 290 is positioned between 0 mm and 5 mm from the top edge of the wall 219 of the crucible 210. In some embodiments, the eave 290 is disposed entirely above the target region 217. In some embodiments, the eave 290 is disposed at most 5 mm above the target region 217. In some embodiments, the bottom of the eave 290 is disposed at the top of the target region 217. In some embodiments, the eave 290 is separated from the nearest bump 280 by between about 0 mm and about 5 mm.

In alternate embodiments, the eave 290 has a cross section that is triangular, square rectangular, or semicircular, but the shape is not so limited, and any protrusive shape is used for the eave 290 in various embodiments. In some embodiments, the eave 290 is formed by a metal punch operation through the exterior of the wall 219 of the crucible 210. In some embodiments, the eave 219 is separately formed of a similar or different durable material as the crucible 210 and then secured to the interior of the wall 219 by welding, bonding adhering or similar method.

Figure 5C:
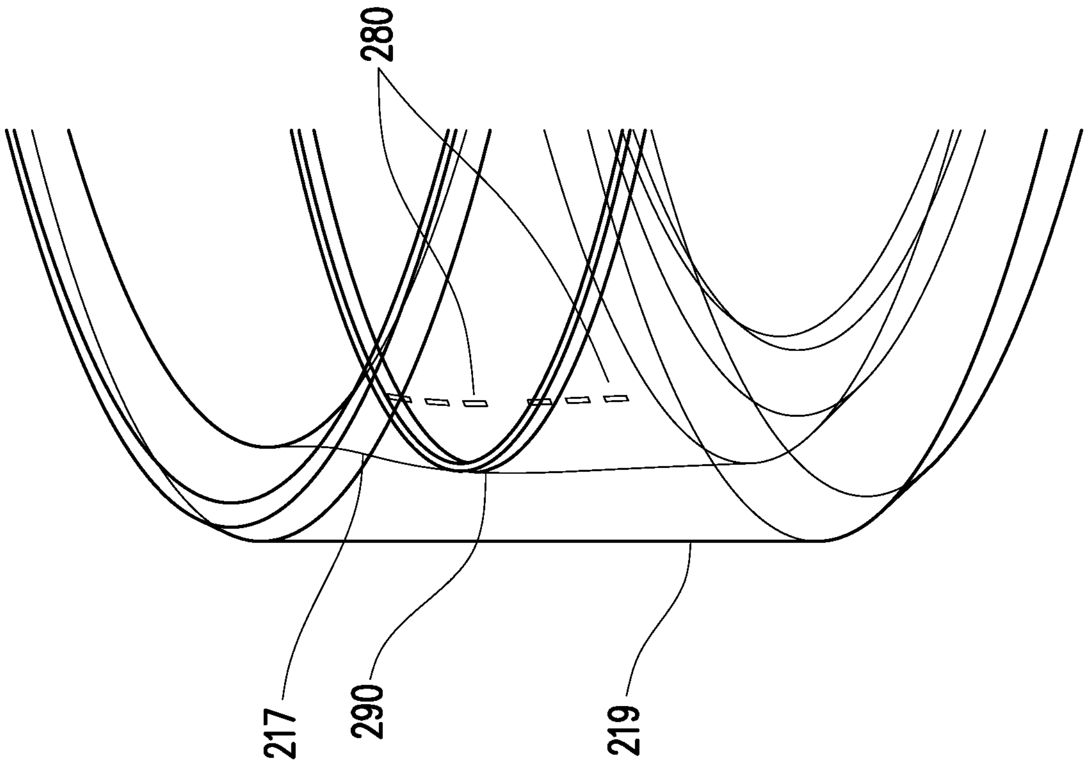
FIG. 5C is an additional view of a portion of crucible in accordance with some embodiments.

FIG. 5C is an additional view of a portion of wall 219 of the crucible 210 in accordance with various embodiments, showing a configuration of the position of the eave 290 and the bumps 280 in relation to the target region 217. In various embodiments, the at least one bump 280 comprises a plurality of separate bumps 280 disposed within the target region 217 around the interior of the wall 219. In some embodiments, the plurality of separate bumps 280 are horizontally aligned around the interior of the wall 219. In alternate embodiments, a cross-section of the bump 280 is a semicircle, a square, a rectangle or other useful shape. In some embodiments, the bump 280 is an irregular shape. In some embodiments, all bumps 280 are the same shape. In other embodiments, one or more bumps 280 are a different shape from another bump 280. In some embodiments, the height of the bump is between about 0.1 mm and about mm. In some embodiments, the width of the bump 280 is between about 0.1 mm and about mm. In some embodiments, the pitch of the end of the bump 280 is between about 0.5 mm and about 1.0 mm. In some embodiments, the pitch of a bump 280 is angled so as to provide a downward force to counter the upward centrifugal force along the wall 219 caused by the rotation of the crucible 210.

Figure 6A:
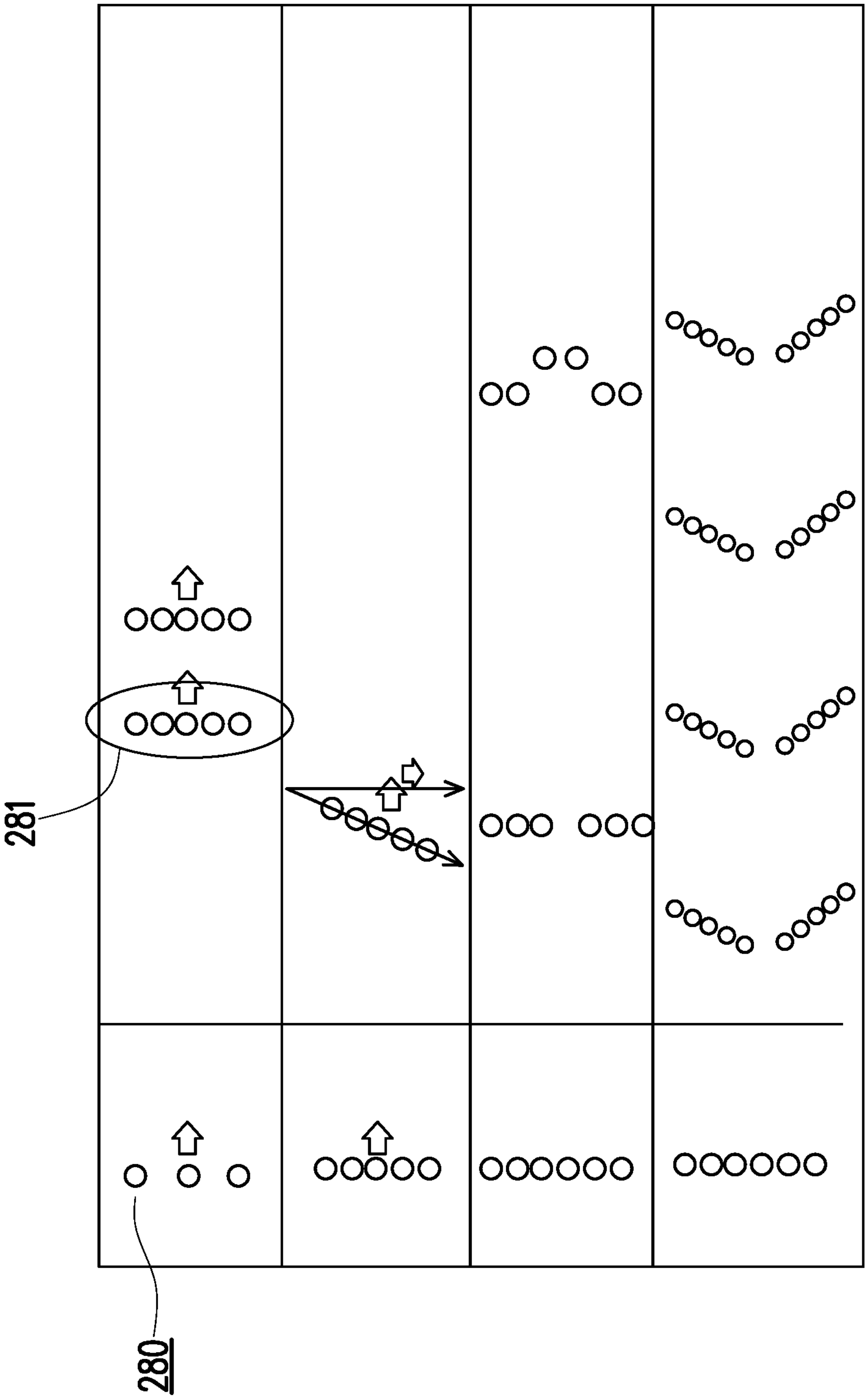
FIG. 6A shows configurations of bumps in accordance with some embodiments.

FIG. 6A shows alternate configurations of groupings 281 of bumps 280 in accordance with various embodiments. In some embodiments, each grouping of proximate bumps 280 includes between 2 and 5 bumps 280. As shown therein, in some embodiments, each grouping 281 of proximate bumps 280 is a single grouping 281. In some embodiments, each grouping 281 of proximate bumps 280 includes two or more proximate groupings 281 of bumps 280. In some embodiments, the bumps 280 within a grouping 281 are densely separated by about 1 mm or less. In some embodiments, the bumps 280 within a grouping 281 are less densely separated by more than 1 mm. In some embodiments, each bump 280 within a grouping 281 are vertically aligned. In other embodiments, one or more bumps 280 within a grouping 281 are not vertically aligned, i.e., are offset with respect to other bumps 280 within a grouping 281. In some embodiments, where there are two proximate groupings 281 of bumps 280, one grouping 281 of bumps 280 are aligned in one direction and the second grouping 281 of bumps 280 are aligned in a different direction. In some embodiments, a grouping 281 of bumps 280 forms an oblique arrangement. In some embodiments, a grouping 281 of bumps 280 is configured in a zig-zag arrangement of bumps. In embodiments where there are two proximate groupings 281 of bumps 280, one grouping 281 of bumps 280 is aligned in the same direction as the second grouping 281 of bumps 280. In various embodiments, a grouping 281 of bumps 280 is aligned along a virtual diagonal line, in order to provide a downward force to counter the upward centrifugal force caused by the rotation of the crucible 210 during operation.

Figure 6B:
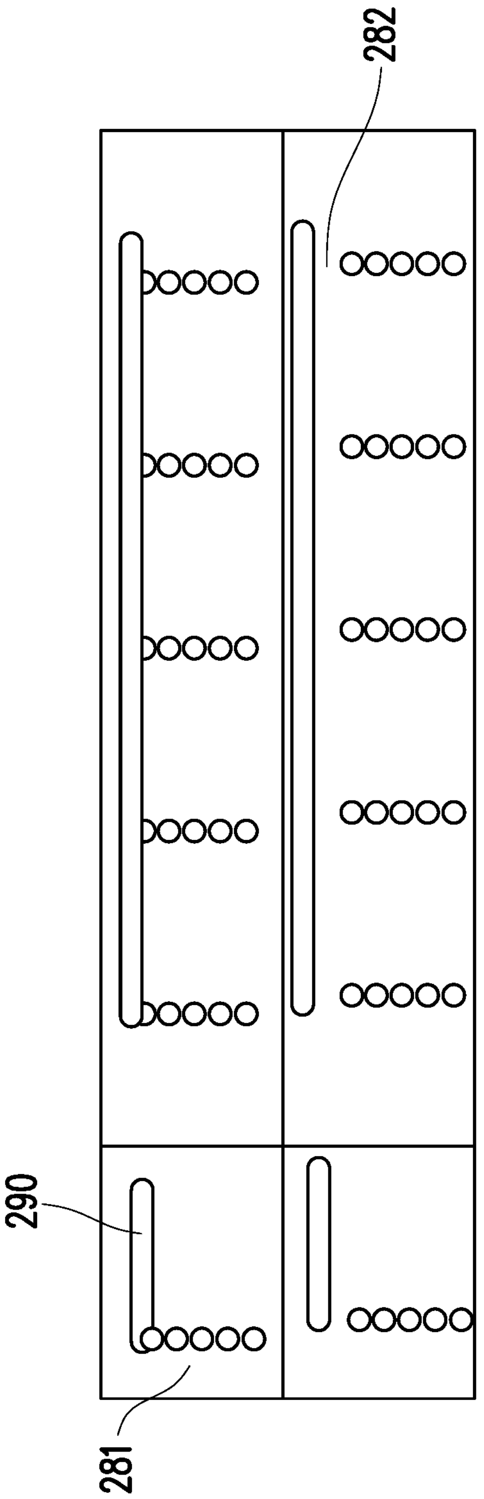
FIG. 6B shows configurations of bumps and eaves in accordance with some embodiments.

FIG. 6B shows alternate configurations of groupings 281 and eaves 290 in accordance with various embodiments. In various embodiments, the eave 290 is disposed above the groupings 281. In some embodiments, the gap 282 between the bottom of the eave 290 and the top of the most proximate bump 280 from a grouping 281 is between about 0 mm and about 5 mm.

Figure 7A:
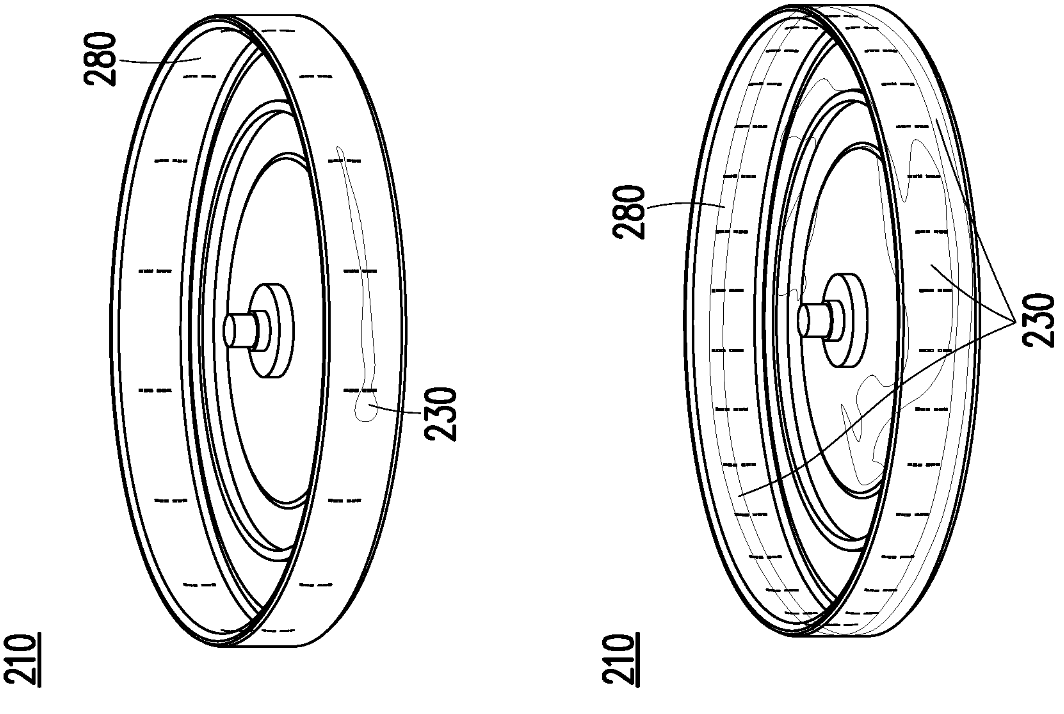
FIG. 7A shows perspective views of a crucible in accordance with some embodiments.

FIG. 7A shows perspective views of the crucible 210 without an eave 290 and the metal debris 230 disposed thereon after operation of the system 10 over time in accordance with various embodiments. The top portion of FIG. 7A shows a crucible 210 with 16 groupings 281 of bumps 280 and the distribution of metal debris 230 on an outside of the crucible 210 in accordance with some embodiments. The bottom portion of FIG. 7A shows a crucible 210 with 16 groupings 281 of bumps 280 and the distribution of metal debris 230 within an interior of the crucible 210 in accordance with some embodiments.

Figure 7B:
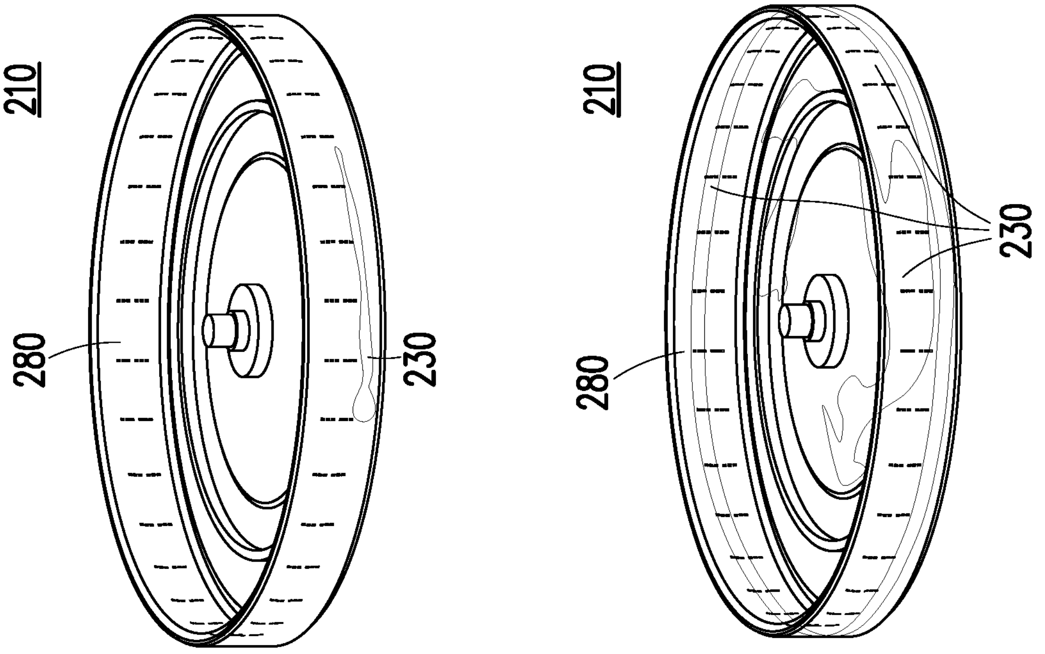
FIG. 7B shows perspective views of a crucible in accordance with some embodiments.

FIG. 7B shows perspective views of the crucible 210 without an eave 290 and the metal debris 230 disposed thereon after operation of the system 10 over time in accordance with various embodiments. The top portion of FIG. 7B shows a crucible 210 with 32 groupings 281 of bumps 280 and the distribution of metal debris 230 on an outside of the crucible 210 in accordance with some embodiments. The bottom portion of FIG. 7B shows a crucible 210 with 16 groupings 281 of bumps 280 and the distribution of metal debris 230 within an interior of the crucible 210 in accordance with some embodiments.

Figure 8A:
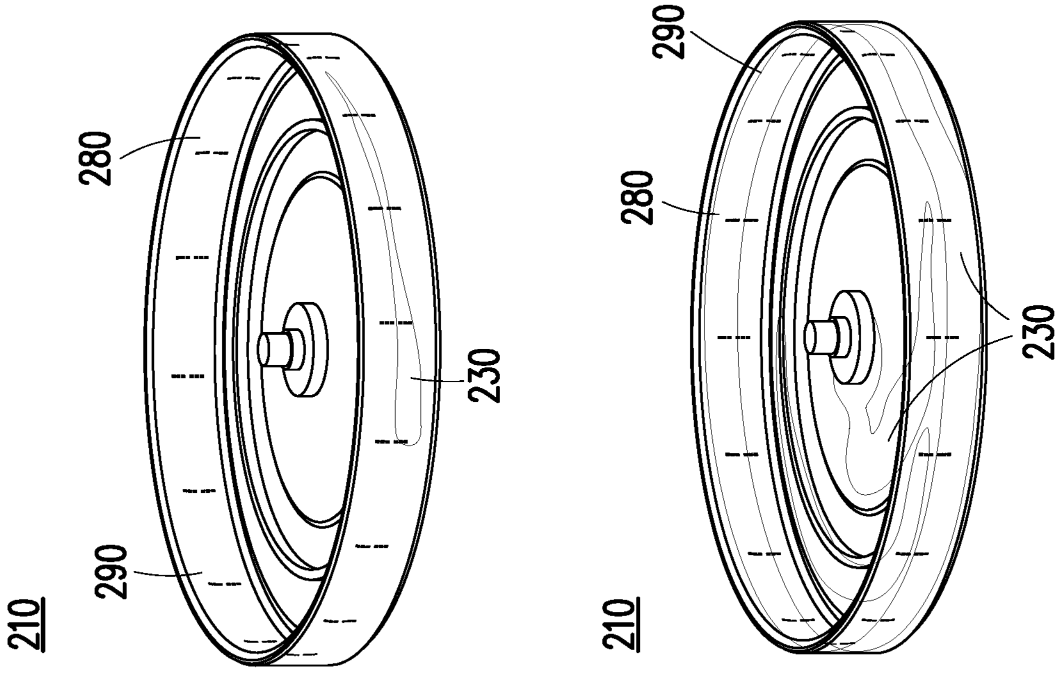
FIG. 8A shows perspective views of a crucible in accordance with some embodiments.

FIG. 8A shows perspective views of the crucible 210 with an eave 290 in accordance with various embodiments. The top portion of FIG. 8A shows a crucible 210 with 16 groupings 281 of bumps 280 and the distribution of metal debris 230 on an outside of the crucible 210 in accordance with some embodiments. The bottom portion of FIG. 8A shows a crucible 210 with 16 groupings 281 of bumps 280 and the distribution of metal debris 230 within an interior of the crucible 210 in accordance with some embodiments.

Figure 8B:
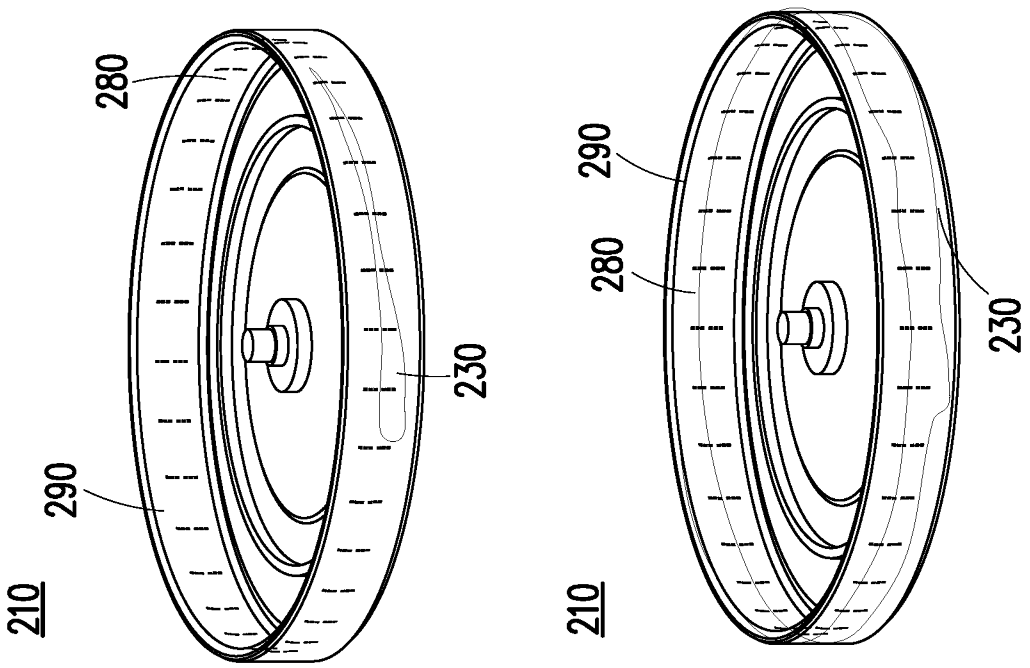
FIG. 8B shows perspective views of a crucible in accordance with some embodiments.

FIG. 8B shows perspective views of the crucible 210 with an eave 290 in accordance with various embodiments. The top portion of FIG. 8B shows a crucible 210 with 32 groupings 281 of bumps 280 and the distribution of metal debris 230 on an outside of the crucible 210 in accordance with some embodiments. The bottom portion of FIG. 8B shows a crucible 210 with 32 groupings 281 of bumps 280 and the lowest distribution of metal debris 230 within an interior of the crucible 210 in accordance with some embodiments.

Figure 9A:
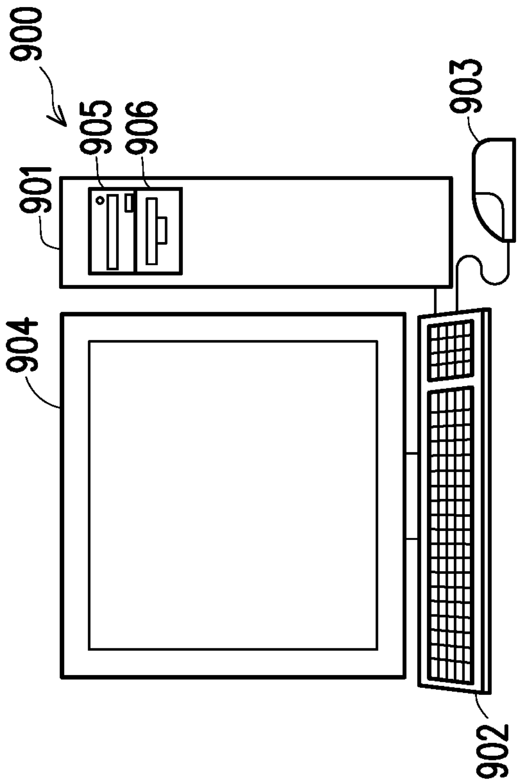
FIG. 9A and FIG. 9B are diagrams of a controller in accordance with some embodiments.
Figure 9B:
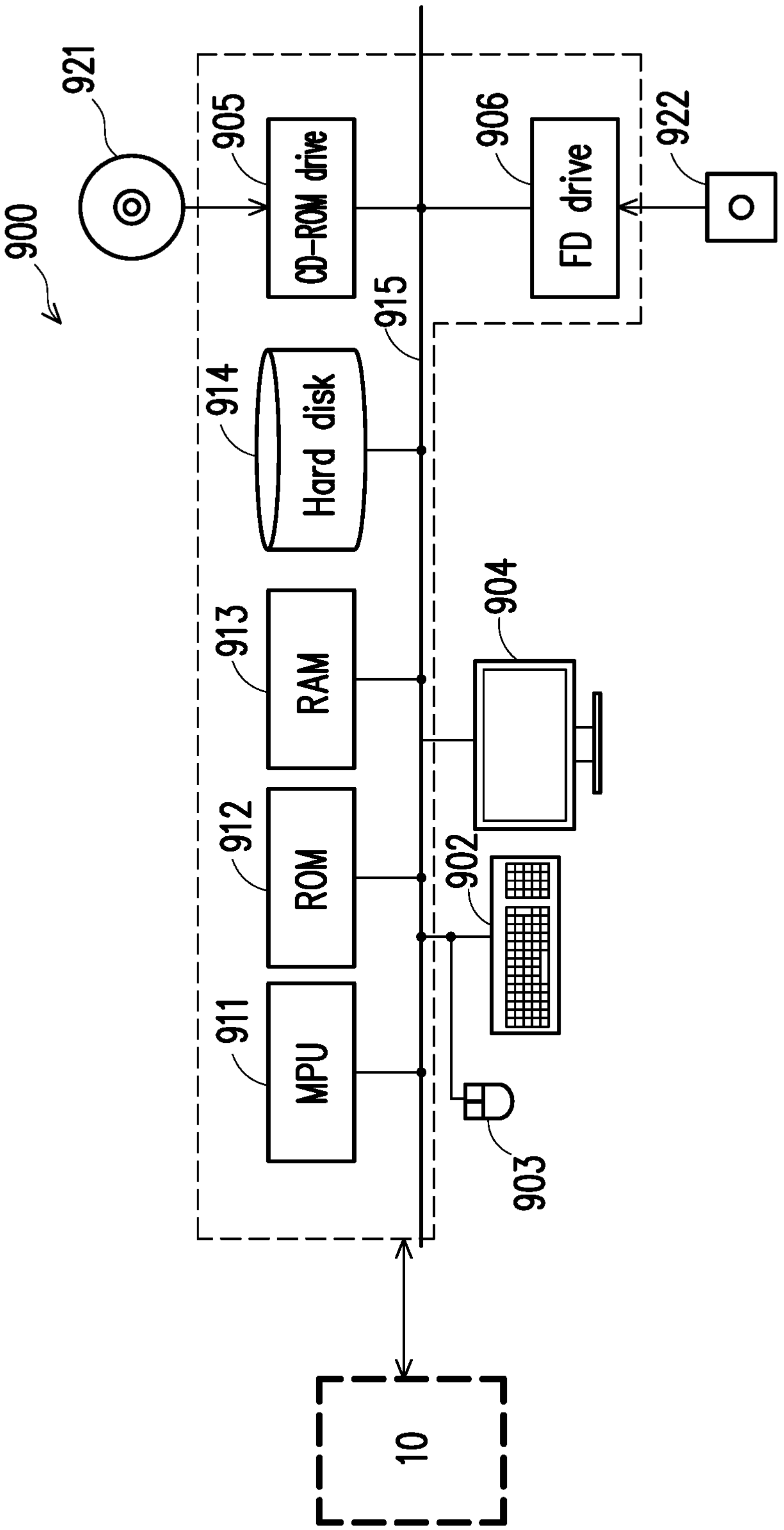

FIG. 9A and FIG. 9B illustrate a computer system 900 for controlling the system 10 and its components in accordance with various embodiments of the present disclosure. FIG. 9A is a schematic view of a computer system 900 that controls the system 10 of FIG. 1 in various embodiments. As shown in FIG. 9A, the computer system 900 is provided with a computer 901 including an optical disk read only memory (e.g., CD-ROM or DVD-ROM) drive 905 and a magnetic disk drive 906, a keyboard 902, a mouse 903 (or other similar user input device), and a monitor 904 for presenting information visually.

FIG. 9B is a diagram showing an internal configuration of the computer system 900. In various embodiments, the computer 901 is provided with, in addition to the optical disk drive 905 and the magnetic disk drive 906, one or more processors 911, such as a micro-processor unit (MPU) or a central processing unit (CPU); a read-only memory (ROM) 912, in which a program such as a boot up program is stored; a random access memory (RAM) 913 that is connected to the processors 911 and in which a command of an application program is temporarily stored, and a temporary electronic storage area is provided; a hard disk 914 in which an application program, an operating system program and system data are stored; and a data communication bus 915 that connects the processors 911, the ROM 912, any computer networks and the like. In various embodiments, the computer 901 includes a network card (not shown) for providing a connection to a computer network such as a local area network (LAN), wide area network (WAN) or any other useful computer network for communicating data used by the computer system 900 and the system 10. In various embodiments, the computer system 900 communicates via wireless or hardwired connection to the system 10 and its components.

The program for causing the computer system 900 to execute the process for controlling the system 10 of FIG. 1, and components thereof, according to the embodiments disclosed herein are stored in an optical disk 921 or a magnetic disk 922, which is inserted into the optical disk drive 905 or the magnetic disk drive 906, and then transmitted to the hard disk 914 in various embodiments. Alternatively, the program is transmitted via a network (not shown) to the computer system 900 and stored by the hard disk 914. At the time of execution, the program is loaded into the RAM 913. The program is loaded from the optical disk 921 or the magnetic disk 922, or directly from a network in various embodiments.

The stored programs do not necessarily have to include, for example, an operating system (OS) or a third-party program to cause the computer 901 to execute the methods disclosed herein. The program only includes a command portion to call an appropriate function (module) in a controlled mode and obtain desired results in some embodiments. In various embodiments described herein, the controller 900 is in communication with and coupled to the lithography system 10 to control various functions thereof. The controller 900 is configured to provide control data to those system components and receive process and/or status data from those system components. For example, the controller 900 comprises a microprocessor, a memory (e.g., volatile or non-volatile memory), and a digital I/O port capable of generating control voltages sufficient to communicate and activate inputs to the processing system 100, as well as monitor outputs from the system 10. In addition, a program stored in the memory is utilized to control the aforementioned components of the system 10 according to a process recipe. Furthermore, the controller 900 is configured to analyze the process and/or status data, to compare the process and/or status data with target process and/or status data, and to use the comparison to change a process and/or control a system component. In addition, the controller 900 is configured to analyze the process and/or status data, to compare the process and/or status data with historical process and/or status data, and to use the comparison to predict, prevent, and/or declare a fault or alarm.

Figure 10:
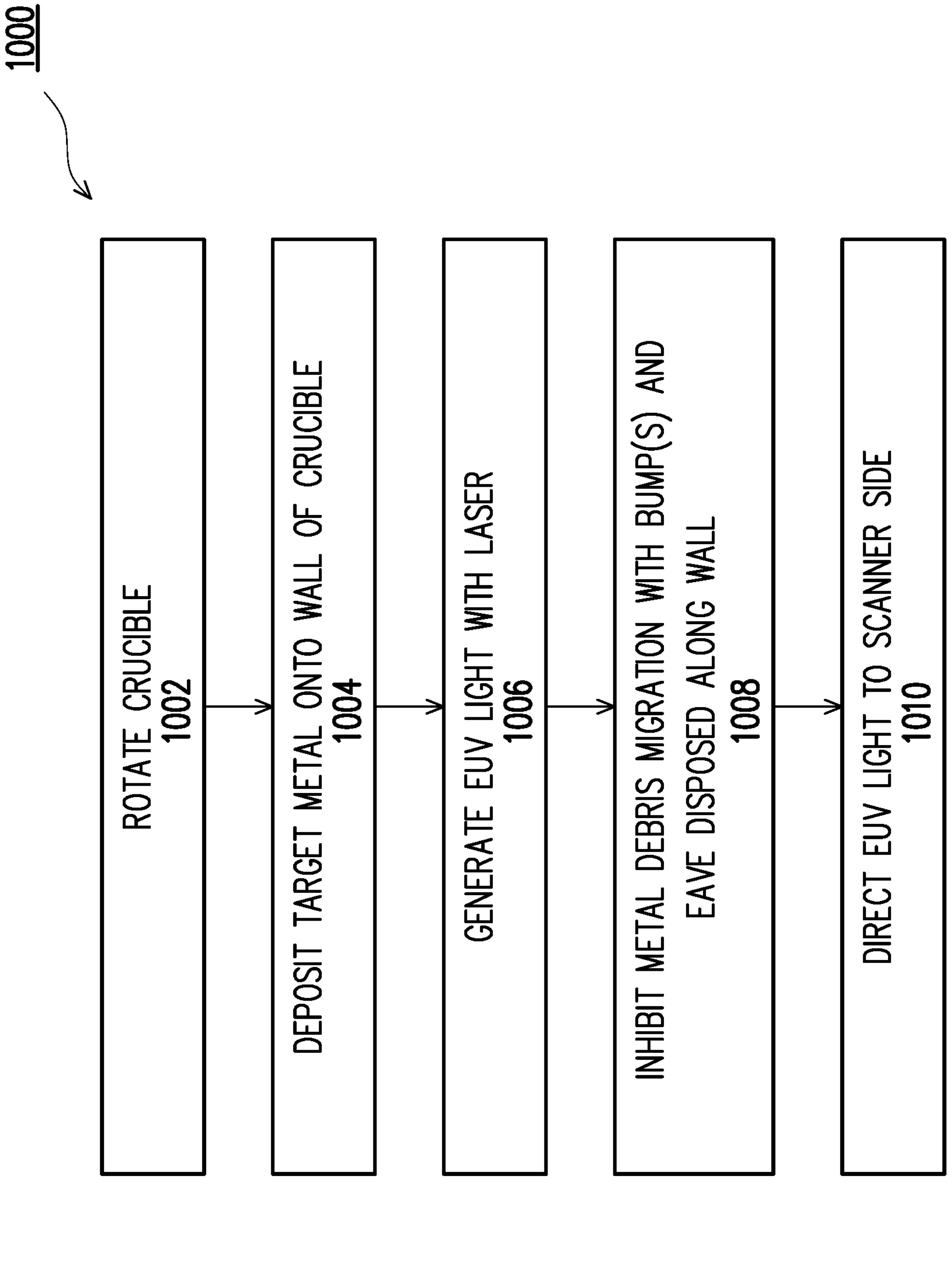
FIG. 10 is a flowchart depicting a process for manufacturing a semiconductor device in accordance with some embodiments.

Turning now to FIG. 10, therein is depicted an exemplary process 1000 for manufacturing a semiconductor device in accordance with various embodiments. In some embodiments, the process 100 is controlled by the controller 900. In some embodiments, the semiconductor device includes a fin field effect transistor (FinFETs), a gate all-around FET (GAA FET), and/or other MOS transistor, together with capacitors, resistances and/or other electronic elements.

In some embodiments where a rotating crucible EUV device is used to generate EUV light, the process 1000 for manufacturing a semiconductor device, first includes rotating the crucible 210 having a wall 219 and a target region 217 that is disposed circumferentially around the interior of the wall 219 (operation 1002). In some embodiments, the crucible is continuously rotated at up to 20,000 RPM. Next, at operation 1004, a metal, such as a liquid Sn metal, is deposited onto the wall 219 of the crucible 210 within the target region 217 while the crucible continues to rotate. In some embodiments, the metal is deposited by the re-filler 216 and preheated by the heater 214.

Next, at operation 1006, extreme ultraviolet (EUV) light 260 is generated from the metal by pulsing or continuously directing laser light 250 from the laser 205 onto the deposited metal within a laser excitation region of the target region 217 in various embodiments. In various embodiments, metal debris 230 in liquid and/or solid form is generated as a result of the vaporizing of the metal by the laser light 250.

In various embodiments, in order to inhibit or otherwise mitigate migration of metal debris 230 around the crucible 210 and to other components of the system 10, at least one bump 280 is disposed on the wall 219 within the laser target region 217 to disrupt the movement of metal debris 230 caused by centrifugal forces within the crucible 210 while it is rotating (operation 1008). In some embodiments, the at least one bump 280 disrupts a laminar flow of liquid metal debris 230 along the interior of the wall 219. In some embodiments, the at least one bump 280 serves to direct at least some of the metal debris 230 to a debris catcher in the debris catching region 213. In various embodiments, the migration of metal debris 230, such as solid and/or liquid metal debris 230 is further inhibited and mitigated by a plurality of groupings 281 of proximate bumps 280 that are evenly distributed around the interior of the wall 219. In some embodiments, there are 16 or 32 groupings 281 of bumps 280 disposed uniformly around the interior of the wall 219. In various embodiments, the migration of metal debris 230, such as solid and/or liquid metal debris 230 is further inhibited and mitigated by an eave 290, such as a convex eave 290 disposed around at least a portion of the interior of the wall. In some embodiments, the eave 290 is disposed within 5 millimeters above the at least one bump 280 or groupings 281 of bumps 280 and above the target region 217.

Next, at operation 1010, the EUV light 260 is directed by optics 220 or the like to one or more layers of a semiconductor device within the scanner side 310 in order to pattern the layer(s) in accordance with design requirements. In various embodiments, the process 1010 continues iteratively until a semiconductor device is completed or the process 1010 is otherwise halted.

As demonstrated in the foregoing, generated EUV light intensity is stabilized by reducing fluctuations of liquid metal flow and mitigating metal debris migration. This, in turn, improves productivity of the system 10 by maintaining laser operating standards, resulting in greater throughput of semiconductor manufacturing processes, and increased revenue generation as well as realized maintenance savings over time.

According to various embodiments, an extreme ultraviolet (EUV) radiation apparatus includes a rotating crucible having an exterior wall with a cross-section that is substantially circular. In various embodiments, a target region is disposed radially around at least a portion of an interior of the wall. In various embodiments, a bump is disposed within the target region for controlling a flow of heated metal within the rotating crucible. In some embodiments, the apparatus further includes a motor for rotating the crucible around a central axis up at up to rotations per minute. In some embodiments, the bump is separately formed and secured to the wall of the rotating crucible. In some embodiments, the apparatus further includes a debris catching region disposed radially around at least a portion of the interior of the wall and at least partially beneath the target region. In some embodiments, a bottom portion of the debris catching region includes an inlet that collects metal debris migrating from the target region. In some embodiments, the debris catching region has a hollow interior region including an outlet, disposed above the inlet. In some embodiments, the inlet is configured to provide metal debris from the bottom portion to the hollow interior region and the outlet is configured to provide the metal debris from the hollow interior region to the target region by centrifugal force. In some embodiments, a re-filler is provided to deposit metal on the target region. In some embodiments, the bump is a grouping of bumps having at least two bumps disposed in proximity. In some embodiments, the at least two bumps are vertically aligned. In some embodiments, a plurality of groupings of bumps are disposed radially around the heated metal target region in horizontal alignment. In some embodiments, each grouping of bumps is evenly separated from a nearest grouping of bumps by between 11.25 degrees and 22.5 degrees. In some embodiments, an eave is disposed around at least a portion of the interior of the wall and above the bump. In some embodiments, the eave is disposed at most 5 millimeters above the bump. In some embodiments, the eave is separated from the bump by between 0 millimeter (mm) and 5 mm. In some embodiments, the bump and eave are formed from the wall. In some embodiments, a heater is circumferentially disposed around an exterior of the wall for heating the target region.

According to various embodiments, a method for manufacturing a semiconductor device includes: (1) rotating a crucible having a wall, and having a laser target region disposed circumferentially around an interior of the wall, (2) depositing a metal within the laser target region; (3) generating extreme ultraviolet (EUV) light by directing laser light on the metal, thereby releasing metal debris; (4) inhibiting migration of metal debris using at least one bump disposed on the wall within the laser target region; and (5) directing the EUV light to a layer of a semiconductor device. In some embodiments, the method further includes inhibiting migration of metal debris using a plurality of groupings of proximate bumps that are evenly distributed around the interior of the wall. In some embodiments, the method further includes inhibiting migration of metal debris using a convex eave formed on at least a portion of the interior of the wall within 5 millimeters above the at least one bump.

According to various embodiments, a crucible for generating extreme ultraviolet (EUV) light has a heated target region internally disposed around an interior of a wall for preheating a metal. In various embodiments, the crucible includes raised arrangements disposed within the heated target region. In various embodiments, a convex eave is disposed above the heated target region. In various embodiments, a debris catching region is at least partially disposed below the heated target region and configured to collect metal debris. In various embodiments, the target region is at least partially replenished by metal debris collected by the debris catching region. In some embodiments, the crucible further has a cover configured to enclose an interior of the crucible during operation.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation apparatus, comprising:

a rotating crucible including a wall having a cross-section that is substantially circular;

a target region disposed radially around at least a portion of an interior of the wall, wherein the target region faces a central axis of the rotating crucible; and a plurality of groupings of bumps disposed within the target region and configured to keep metal debris below a level of the interior of the wall and control a flow of heated metal within the rotating crucible, wherein the plurality of groupings of bumps are disposed radially around the target region in horizontal alignment, and the plurality of groupings of bumps are circumferentially spaced apart from one another by an angular interval separated around the central axis of the rotating crucible.

2. The apparatus of claim 1, wherein the plurality of groupings of bumps are separately formed and secured to the wall of the rotating crucible.

3. The apparatus of claim 1, further comprising a motor configured to rotate the rotating crucible around a central axis up to 20,000 rotations per minute.

4. The apparatus of claim 1, further comprising a debris catching region disposed radially around at least a portion of the interior of the wall and at least partially beneath the target region.

5. The apparatus of claim 4, wherein a bottom portion of the debris catching region includes an inlet that collects the metal debris migrating from the target region.

6. The apparatus of claim 5, wherein the debris catching region has a hollow interior region including an outlet, disposed above the inlet, wherein the inlet is configured to provide the metal debris from the bottom portion to the hollow interior region and the outlet is configured to provide the metal debris from the hollow interior region to the target region by centrifugal force.

7. The apparatus of claim 1, further comprising a re-filler configured to deposit metal on the target region.

8. The apparatus of claim 1, wherein a grouping of bumps of the plurality of groupings of bumps has at least two bumps disposed in proximity.

9. The apparatus of claim 8, wherein the at least two bumps are vertically aligned.

10. The apparatus of claim 8, wherein the plurality of groupings of bumps are evenly separated by between 11.25 degrees and 22.5 degrees.

11. The apparatus of claim 1, further comprising an eave disposed around at least a portion of the interior of the wall and above a grouping of bumps of the plurality of groupings of bumps.

12. The apparatus of claim 11, wherein the eave is disposed at most 5 millimeters above the grouping of bumps of the plurality of groupings of bumps.

13. The apparatus of claim 11, wherein the eave is separated from the grouping of bumps of the plurality of groupings of bumps by between 0 millimeter (mm) and 5 mm.

14. The apparatus of claim 11, wherein the grouping of bumps of the plurality of groupings of bumps and the eave are formed from the wall.

15. The apparatus of claim 1, further comprising a heater circumferentially disposed around an exterior of the wall and configured to heat the target region.

16. A method for manufacturing a semiconductor device, comprising:

rotating a crucible having a wall and a laser target region disposed circumferentially around an interior of the wall, wherein the laser target region faces a central axis of the crucible;

depositing a metal within the laser target region;

generating extreme ultraviolet (EUV) light by directing laser light on the metal, thereby releasing metal debris;

inhibiting migration of metal debris using a plurality of groupings of bumps disposed radially around on the interior of the wall within the laser target region by keeping the metal debris below a level of the interior of the wall, wherein the plurality of groupings of bumps are disposed radially around the laser target region in horizontal alignment, and the plurality of groupings of bumps are circumferentially spaced apart from one another by an angular interval around the central axis of the crucible; and directing the EUV light to a layer of a semiconductor device.

17. The method of claim 16, wherein groupings of proximate bumps of the plurality of groupings of bumps are evenly separated around the interior of the wall.

18. The method of claim 17, further comprising:

inhibiting the migration of the metal debris using a convex eave formed on at least a portion of the interior of the wall within 5 millimeters above a grouping of bumps of the groupings of proximate bumps.

19. A crucible for generating extreme ultraviolet (EUV) light, comprising:

a heated target region internally disposed around an interior of a wall of the crucible for preheating a metal, wherein the heated target region faces a central axis of the crucible;

a plurality of groupings of raised arrangements disposed within the heated target region, wherein the plurality of groupings of raised arrangements are disposed radially around the heated target region in horizontal alignment, wherein each grouping of raised arrangements is evenly and circumferentially separated by an angular interval around the central axis of the crucible by between 11.25 degrees and 22.5 degrees;

a convex eave disposed above the heated target region; and a debris catching region at least partially disposed below the heated target region and configured to collect metal debris, wherein the heated target region is at least partially replenished by metal debris collected by the debris catching region.

20. The crucible of claim 19, further comprising a cover configured to enclose an interior of the crucible during operation.

* * * * *